(12) United States Patent
Nagatani et al.

(10) Patent No.: US 6,836,517 B2
(45) Date of Patent: Dec. 28, 2004

(54) DISTORTION COMPENSATING APPARATUS

(75) Inventors: Kazuo Nagatani, Kawasaki (JP);
Tokuro Kubo, Kawasaki (JP);
Takayoshi Ode, Kawasaki (JP);
Yasuyuki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 811 days.

(21) Appl. No.: 09/745,948

(22) Filed: Dec. 22, 2000

(65) Prior Publication Data

US 2001/0005402 A1 Jun. 28, 2001

(30) Foreign Application Priority Data

Dec. 28, 1999 (JP) ............................................ 11-372884

(51) Int. Cl.$^7$ .......................... H04K 1/02; H04L 25/03; H04L 25/49
(52) U.S. Cl. ...................................... 375/296; 375/297
(58) Field of Search ........................ 375/296; 330/149; 455/126, 295

(56) References Cited

U.S. PATENT DOCUMENTS

| | | | | |
|---|---|---|---|---|
| 5,870,668 A | * | 2/1999 | Takano et al. | 455/126 |
| 5,903,611 A | * | 5/1999 | Schnabl et al. | 375/297 |
| 6,133,789 A | * | 10/2000 | Braithwaite | 330/149 |
| 6,490,010 B1 | * | 12/2002 | Shibuya et al. | 348/735 |
| 6,657,493 B2 | * | 12/2003 | Ode et al. | 330/149 |
| 2003/0228856 A1 | * | 12/2003 | Orihashi et al. | 455/226.1 |

FOREIGN PATENT DOCUMENTS

| | | | | |
|---|---|---|---|---|
| JP | 2-10902 | * | 1/1990 | ............. H03F/1/32 |
| JP | 09074371 | | 3/1997 | |
| JP | 11251972 | | 9/1999 | |

\* cited by examiner

Primary Examiner—Stephen Chin
Assistant Examiner—Lawrence B. Williams
(74) Attorney, Agent, or Firm—Katten Muchin Zavis Rosenman

(57) ABSTRACT

A distortion compensating apparatus for compensating for a distortion of a transmission power amplifier. A delay time decision unit calculates the correlation between a transmission signal and a feedback signal fed back from the output side of the transmission power amplifier while varying phase difference between both signals, and decides the total delay time caused in the transmission power amplifier and a feedback loop on the basis of the phase difference in which the correlation is the maximum. A delay unit delays the transmission signal before a distortion compensation processing by the total delay time, and inputs the delayed signal into a distortion compensating apparatus arithmetic unit, which calculates and stores a distortion compensation coefficient on the basis of the transmission signal and the feedback signal fed back from the output side of the transmission power amplifier. A pre-distortion unit applies a distortion compensation processing to the transmission signal by using the distortion compensation coefficient.

22 Claims, 25 Drawing Sheets

DISTORTION COMPENSATING APPARATUS

BACKGROUND OF THE INVENTION

The present invention relates to a distortion compensating apparatus and, more particularly, to a distortion compensating apparatus for compensating for a distortion of a transmission power amplifier, using the correlation between a transmission signal and a feedback signal, and adjusting a timing of each element of the distortion compensating apparatus on the basis of a delay time obtained.

Frequency resources have become strained in recent years and greater reliance is being placed upon highly efficient digital transmission in radio communication. In a case where multivalued amplitude modulation is applied to radio communication, an important technique used on the transmission side is to linearize the amplification characteristic of a power amplifier to suppress a nonlinear distortion thereby and reduce the leakage power between adjacent channels. In a case where an amplifier having an inferior linearity is used and an attempt is made to improve the power efficiency, a technique for compensating for the distortion produced by this amplifier is essential.

FIG. 23 is a block diagram of an example of a transmitter in a conventional radio apparatus. A transmission signal generator 1 sends a group of serial digital data, and a serial/parallel (S/P) converter 2 alternately separates the group of digital data bit by bit into an in-phase component (I) signal and a quadrature component (Q) signal. A D/A converter 3 converts each of the I signals and Q signals into analog baseband signals and inputs the base band signals into a quadrature modulator 4. The quadrature modulator 4 multiplies the input I and Q signals (transmission baseband signals) by a reference carrier wave and signal phase-shifted from the reference carrier by 90°, respectively, adds the two products, thereby performing a quadrature conversion, and outputs the result. A frequency converter 5 mixes the signal subjected to quadrature modulation and a local oscillation signal to perform a frequency conversion, and a transmission power amplifier 6 amplifiers the power of the carrier wave output by the frequency converter 5 and radiates the amplified signal into space from an antenna 7.

In such a transmitter, the input/output characteristic (distortion function f(p)) of the signal is a non-linear characteristic, as indicated by the dashed line in FIG. 24A. This nonlinear characteristic produces a nonlinear distortion, and a frequency spectrum centered about a transmission frequency $f_0$ possesses side lobes, as indicated by the dashed line in FIG. 24B. This results in a leakage of the signal into the adjacent channels and causes interference on the adjacent channels. To prevent this, a Cartesian loop method, a polar loop method, etc. have been proposed as a technique for compensating a distortion of a feedback system, and a distortion of a power amplifier is suppressed.

FIG. 25 is a block diagram of a transmission apparatus having a function for digitally compensating for a nonlinear distortion by using a DSP (Digital Signal Processor). The group of digital data (transmission signals) sent from the transmission signal generator 1 is converted into I signals or Q signals by the S/P converter 2, and input into a distortion compensator 8 which is constituted by a DSP. The distortion compensator 8 as shown in the functional diagram of FIG. 26, is provided with a distortion compensation function memory 8a for storing the distortion compensation coefficient h(pi) (i=0~1023) which corresponds to the power level 0~1023 of a transmission signal, a pre-distortion unit 8b which applies a distortion compensation processing (pre-distortion) to the transmission signal by using the distortion compensation coefficient h(pi) which corresponds to the level of the transmission signal, and a distortion compensation coefficient arithmetic unit 8c which compares a transmission signal with a (feed back) signal demodulated by a later-described quadrature detector, and which calculates and updates the distortion compensation coefficient h(pi) by using the error.

The distortion compensator 8 applies a pre-distortion processing to the transmission signal by using the distortion compensation coefficient h(pi) which corresponds to the level of the transmission signal, and inputs the processed signal to the DA converter 3. The DA converter 3 converts the input I and Q signals into analog baseband signals and inputs the baseband signals into the quadrature modulator 4. The quadrature modulator 4 multiplies the input I and Q signals by a reference carrier wave and a signal phase-shifted from the reference carrier by 90°, respectively, adds the two products, thereby performing a quadrature conversion, and outputs the result. The frequency converter 5 mixes the signal subjected to quadrature modulation signal with a local oscillation signal to perform a frequency conversion, and the transmission power amplifier 6 amplifiers the power of the carrier wave output from the frequency converter 5 and radiates the amplified signal into space from the antenna 7. A part of the transmission signals are input into a frequency converter 10 via a directional coupler 9. The frequency converter 10 converts the frequency of the signals and inputs them into a quadrature detector 11. The quadrature detector 11 multiplies each of the input signal by the reference carrier wave and by the signal phase-shifted from the reference carrier by 90°, thereby performing quadrature detection and reproducing the baseband I, Q signals from the transmission side, and inputs these signals into an AD converter 12. The AD converter 12 converts the input I and Q signals into digital signals and inputs them into the distortion compensator 8. The distortion compensator 8 compares the transmission signal before a distortion compensation processing with the feedback signal which is demodulated by the quadrature detector 11 by an adaptive algorithm using the LMS (Least Means Square) method, and calculates and updates the distortion compensation coefficient h(pi) by using an error between the transmission signal and the feedback signal. The transmission signal to be sent next is then subjected to a pre-distortion processing using the updated distortion compensation coefficient h(pi), and the processed signal is output. The above-described operation is repeated thenceforce, thereby suppressing the nonlinear distortion of the transmission power amplifier 6 and reducing the power leaked to the adjacent channels.

FIG. 27 is an explanatory view of the distortion compensation processing based on an adaptive algorithm using an LMS method. The reference numeral 21a denotes a multiplier (pre-distortion unit) for multiplying a transmission signal (input baseband signal) x(t) by a distortion compensation coefficient $h_n(p)$, 21b a DA converter for converting the transmission signal subjected to a distortion compensation processing into an analog signal, 21c a device (transmission power amplifier) in which a distortion generates and which has a distortion function f(p), 21d a feedback system for feeding back a signal y(t) output from the transmission power amplifier, 21e an AD converter for converting a feedback signal into a digital signal, and 21f a distortion compensation coefficient memory for storing the distortion compensation coefficient $h_n(p)$ in correspondence with the power p $(=|x(t)|^2)$ of the transmission signal x(t).

The distortion compensation coefficient memory 21f updates the distortion compensation coefficient $h_n(p)$ by a distortion compensation coefficient $h_{n+1}(p)$ which is obtained by an LMS algorithm.

The reference numeral 21g denotes an arithmetic unit for calculating the power p ($=|x(t)|^2$) of the transmission signal x(t) and outputs the power as a reading address, 21h a delay circuit for generating a writing address of the distortion compensation coefficient memory 21f. It takes a predetermined time to obtain a new distortion compensation coefficient $h_{n+1}(p)$ since the distortion compensation coefficient $h_n(p)$ at the address which is indicated by the power p of the transmission signal x(t) is read. Therefore, the delay circuit 21h delays the generation of a writing address by the predetermined time, so as to be able to update the old distortion compensation coefficient $h_n(p)$ by the new distortion compensation coefficient $h_{n+1}(p)$. The reference numeral 21h denotes a delay time adjuster.

The reference numeral 21j denotes a distortion compensation coefficient arithmetic unit for calculating by an LMS adaptive algorithm and updating a distortion compensation coefficient in such a manner that the error is zero. In the distortion compensation coefficient arithmetic unit 21j, the reference numeral 21j-1 denotes a subtracter for outputting the difference e(t) between a transmission signal x(t) before a distortion compensation processing and a feedback signal y(t), 21j-2 a delay circuit for adjusting the timings of a transmission signal x(t) and a feedback signal y(t), 21j-2' a delay time adjuster for adjusting the delay time of the delay circuit 21j-2, 21j-3 a multiplier for multiplying the error e(t) by a step size parameter $\mu(<1)$, 21j-4 a conjugate complex signal outputting unit for outputting a conjugate complex signal y*(t), 21j-5 a multiplier for multiplying $h_n(p)$ by y*(t), 21j-6 a multiplier for multiplying $\mu e(t)$ by u*(t), 21j-7 a delay circuit for adjusting the timing for outputting the distortion compensation coefficient $h_n(p)$, 21j-8 an adder for adding the distortion compensation coefficient $h_n(p)$ and $\mu e(t)u^*(t)$, and 21j-9 a delay time adjuster for adjusting the delay time of the delay circuit 21j-7.

The distortion compensation coefficient arithmetic unit 21j having the above-described structure performs the following operations:

$$h_{n+1}(p) = h_n(p) + \mu e(t)u^*(t)$$

$$e(t) = x(t) - y(t)$$

$$y(t) = h_n(p)x(t)f(p)$$

$$u(t) = x(t)f(p) = h^*_n(p)y(t)$$

$$P = |x(t)|^2$$

wherein the symbols x, y, f, h, u and e represent complex numbers and *a conjugate complex number. By executing the arithmetic processing shown above, the distortion compensation coefficient $h_n(p)$ is updated, and eventually converges on the optimum distortion compensation coefficient, which compensates for the distortion of the transmission power amplifier.

In a conventional distortion compensating method, however, there is one problem. If it is assumed that the delay time of the transmission power amplifier 21c is $D_0$, and the delay time of the feedback system 21d is $D_1$, it is necessary to set the delay time D in each of the delay circuits 21h, 21j-2 and 21j-7 in such a manner as to satisfy the following formula:

$$D = D_0 + D_1$$

However, since the devices such as the transmission power amplifier 21c and the feedback system 21d have individual differences, the total delay time D varies. For this reason, it is conventionally necessary to manually adjust the delay times of the delay circuits 21h, 21j-2 and 21j-7 one by one by using a delay time adjusting switches 21i, 21j-2' and 21j-9. In spite of such a troublesome delay time adjusting operation, high precision cannot be expected.

SUMMARY OF THE INVENTION

Accordingly, it is an object of the present invention to eliminate the above-described problems in the related art, and to enable a delay time to be automatically measured and the measured delay time to be set in a delay circuit.

It is another object of the present invention to enable a delay time to be measured with high precision and the measured delay time to be set in a delay circuit.

To achieve these objects, in a first aspect of the present invention, there is provided a distortion compensating apparatus comprising: (1) a pre-distortion unit for applying a distortion compensation processing to a transmission signal by using a distortion compensation coefficient, (2) a distortion compensation coefficient arithmetic unit for calculating a distortion compensation coefficient on the basis of the transmission signal before the distortion compensation processing and a feedback signal sent from an output side of a transmission power amplifier, (3) a distortion compensation coefficient memory for storing the calculated distortion compensation coefficient in correspondence with the transmission signal, (4) a delay time decision unit for calculating the correlation between the transmission signal and the feedback signal while varying the phase difference between both signals, and deciding the total delay time caused in the transmission power amplifier and a feedback loop on the basis of the phase difference in which the correlation is the maximum, and (5) a delay unit for delaying the transmission signal by the decided delay time, and inputting the delayed transmission signal into the distortion compensation coefficient arithmetic unit.

In a second aspect of the present invention, there is provided a distortion compensating apparatus comprising: (1) a pre-distortion unit for applying a distortion compensation processing to a transmission signal by using a distortion compensation coefficient at sampling period of the transmission signal, (2) a distortion compensation coefficient arithmetic unit for calculating a distortion compensation coefficient on the basis of the transmission signal before the distortion compensation processing and a feedback signal sent from the output side of a transmission power amplifier, (3) a distortion compensation coefficient memory for storing the calculated distortion compensation coefficient in correspondence with the transmission signal, (4) a feedback signal delay unit for controlling the amount of delay at interval of time shorter than the sampling period of the transmission signal, (5) a correlation arithmetic unit for calculating the correlation between the transmission signal and the feedback signal while sequentially varying the time difference between both signals at interval of the sampling period, (6) a control unit for obtaining the amount of delay in the feedback signal delay unit and the time difference in which the correlation is the maximum, and deciding the total delay time caused in the transmission power amplifier and a feedback loop on the basis of the amount of delay and the time difference, and (7) a transmission signal delay unit for delaying the transmission signal by the total delay time, and inputting the delayed transmission signal into the distortion compensation coefficient arithmetic unit.

To state this concretely, the control unit (1) obtains the time difference in the unit of sampling period in which the correlation is the maximum while the amount of delay in the feedback signal delay unit is held constant, and then (2) fixes the time difference between the transmission signal and the feedback signal in the correlator at the delay time obtained, and adjusts the amount of delay which is smaller than the sampling period in the feedback signal delay unit in such a manner that the correlation is the maximum.

Alternatively, the control unit (1) obtains the time difference in the sampling period in which the correlation is the maximum while the amount of delay in the feedback signal unit is held constant, (2) sets the time difference as the delay time in the transmission signal delay unit, thereby canceling the delay time in the unit of the sampling period, (3) fixes the time difference between a transmission signal and a feedback signal in the correlator at 0, and (4) adjusts the delay time which is smaller than the sampling period in the feedback signal delay unit in such a manner that the correlation is the maximum.

Other features and advantages of the present invention will be apparent from the following description taken in conjunction with the accompanying drawings.

BRIEF DESCRIPTION OF THE DRAWINGS

FIG. 21 shows an embodiment of a delay time decision unit which adjusts the delay time by using a training signal when the power is turned on;

DESCRIPTION OF THE PREFERRED EMBODIMENTS (A) Schematic Explanation of the Invention (a) First Invention In FIG. 1, the reference numeral 51a denotes a pre-distortion unit for multiplying a transmission signal x(t) by a distortion compensation coefficient $h_n(p)$ (actually a complex number), 51b a D/A converter, 51c a device (e.g., transmission power amplifier) in which a distortion generates, 51d a feedback system, 51e an A/D converter, 51f a distortion compensation coefficient memory for storing the distortion compensation coefficient $h_n(p)$ corresponding to the power p of a transmission signal x(t), 51g an arithmetic unit for calculating the power p of a transmission signal (x)t, 51h a delay circuit for generating a writing address, and 51i a distortion compensation coefficient arithmetic unit for calculating a distortion compensation coefficient by an adaptive algorithm using the LMS (Least Means Square) method.

Figure 1:
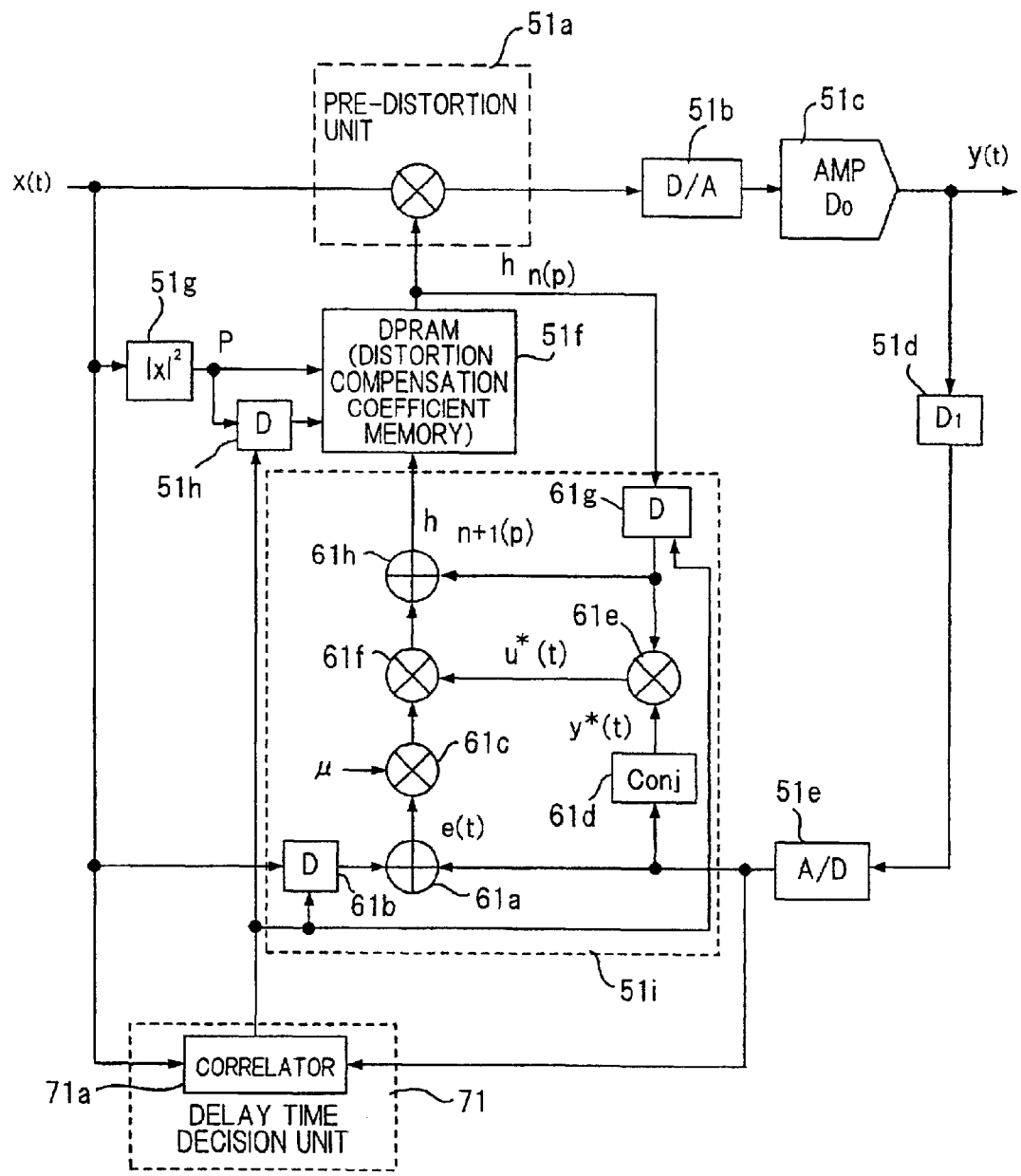
FIG. 1 is a schematic explanatory view of a first present invention.

In the distortion compensation coefficient arithmetic unit 51i, the reference numeral 61a denotes a subtracter for outputting the difference e(t) between a transmission signal x(t) before a distortion compensation processing and a feedback signal y(t), 61b a delay circuit for adjusting the timing of the transmission signal, 61c a multiplier for multiplying an error e(t) by a step size parameter $\mu$, 61d a conjugate complex signal outputting unit for outputting a conjugate complex signal y*(t), 61e a multiplier for multiplying $h_n(p)$ by y*(t), 61f a multiplier for multiplying $\mu e(t)$ by u*(t), 61g a delay circuit for adjusting the timing for outputting a distortion compensation coefficient $h_n(p)$, and 61h an adder for adding a distortion compensation coefficient $h_n(p)$ and $\mu e(t)u^*(t)$.

A delay time decision unit 71 calculates the correlation between a transmission signal x(t) before a distortion compensation processing and a feedback signal, decides the total delay time ($D_0+D_1$) caused in the transmission power amplifier 51c, the feedback system 51d, etc. on the basis of the maximum correlation, and sets the total delay time in each of the delay circuits 51h, 61b and 61g. That is, attention is paid to the correlation between a transmission signal x(t) and a feedback signal, both signals are input to a correlator 71a, the correlation obtained by adjusting time difference between both signals is monitored, and the timed difference at which the correlation is the maximum is set as the total amount of delay due to the transmission power amplifier and a device in the feedback loop, thereby compensating for a distortion.

In the first example of calculating the correlation, the delay time decision unit 71 sequentially shifts the phase difference (time difference) between a transmission signal x(t) and a feedback signal y(t) at interval of the sampling period of the transmission signal x(t), the correlation between the transmission signal x(t) and the feedback signal y(t) is calculated in each phase difference, and the phase difference (time difference) in which the correlation is the maximum is set in each delay circuit as the delay time $(D_0+D_1)$.

In the second example of calculating the correlation, if the transmission signal x(t) is N-oversampled, the delay time decision unit 71 (1) sequentially shifts the phase difference (time difference) between the transmission signal x(t) and the feedback signal y(t) at interval of N-oversampling period (=N×eversampling period) and obtains the first time difference in the unit of N-oversampling period in which the correlation is the maximum, (2) Calculates correlation between the transmission signal x(t) and the feedback signal y(t) in the vicinity of the first time difference by sequentially shifting the time difference between both signals at interval of the oversampling period and obtains the second time difference in the unit of oversampling period in which the correlation is the maximum, and (3) determines the total delay time on the basis of the first and second time differences. In this manner, it is possible to shorten the time required for determining the delay time.

In the third example of calculating the correlation, the delay time decision unit 71 (1) calculates correlations between the transmission signal x(t) and the feedback signal y(t) while sequentially shifting the phase difference (time difference) at interval of the sampling period, calculates the correlations for one period of the transmission signal and stores them, (2) similarly calculates and stores the correlations for each of a plurality of periods, (3) calculates the average of correlations for the plurality of periods for each time difference, and (4) determines the delay time on the basis of the time difference in which the average value is the maximum. In this manner, it is possible to decide the total delay time with high precision and set it in each delay circuit.

As the correlator 71a in the delay time decision unit 71; a sliding correlator or matched filter is used. Use of a sliding correlator is able to simplify the structure of the apparatus, while use of a matched filter is able to shorten the time for the decision of the delay time.

The delay time decision unit 71 periodically calculates the correlation between a transmission signal and a feedback signal even during a distortion compensation control, and stops the distortion compensating operation or the distortion compensation coefficient updating operation, thereby re-determining the total delay time and resetting it in each delay circuit, when the difference between the delay time in which the correlation is the maximum and the total delay time determined at the initiation of the operation exceeds a preset time. In this manner, it is possible to re-determine and reset the total delay time and to maintain the effect of distortion compensation when the delay in a feedback system changes with the lapse of time or for other reasons and the leakage of power to the adjacent channels increases.

The delay time decision unit 71 monitors the difference between a transmission signal and a feedback signal during a distortion compensating operation, and stops the distortion compensating operation or the distortion compensation coefficient updating operation, thereby re-determining the delay time and resetting it in each delay circuit, when the difference exceeds a certain threshold value. When the delay in a feedback system changes with the lapse of time or for other reasons and the leakage of power to the adjacent channels increases, the difference between a transmission signal and a feedback signal increases. It is therefore possible to re-determine and reset the delay time and to maintain the effect of distortion compensation by monitoring the difference.

When there is known signal which is constantly transmitted, the delay time decision unit 71 calculates the correlation between the known signal and a feedback signal, and determines the total delay time on the basis of the maximum correlation. In such a manner, since it is possible to define the reference signals for the calculation of the correlation, calculation with high precision is enabled.

The delay time decision unit 71 calculates correlations between training signals inserted into a transmission signal at the time of decision of the delay time and a feedback signal, and determines the total delay time on the basis of the maximum correlation. In this manner, since it is possible to define the reference signals for the calculation of the correlation, calculation with high precision is enabled.

The distortion compensating apparatus sets the total delay time obtained on the basis of the maximum correlation in each delay circuit, and executes a distortion compensating operation. A DLL (Delay Locked Loop) circuit is provided in the distortion compensating apparatus. A transmission signal delayed by the delay circuit and a feedback signal are input into the DLL circuit, which controls the amount of delay in such a manner that the phase difference between both signals is zero. In this manner, even if the delay in a feedback system or the like changes with the lapse of time or for other reasons, it is possible to maintain the total delay time at a constant value, thereby obtaining the effect of distortion compensation.

(b) Second Invention

Figure 2:
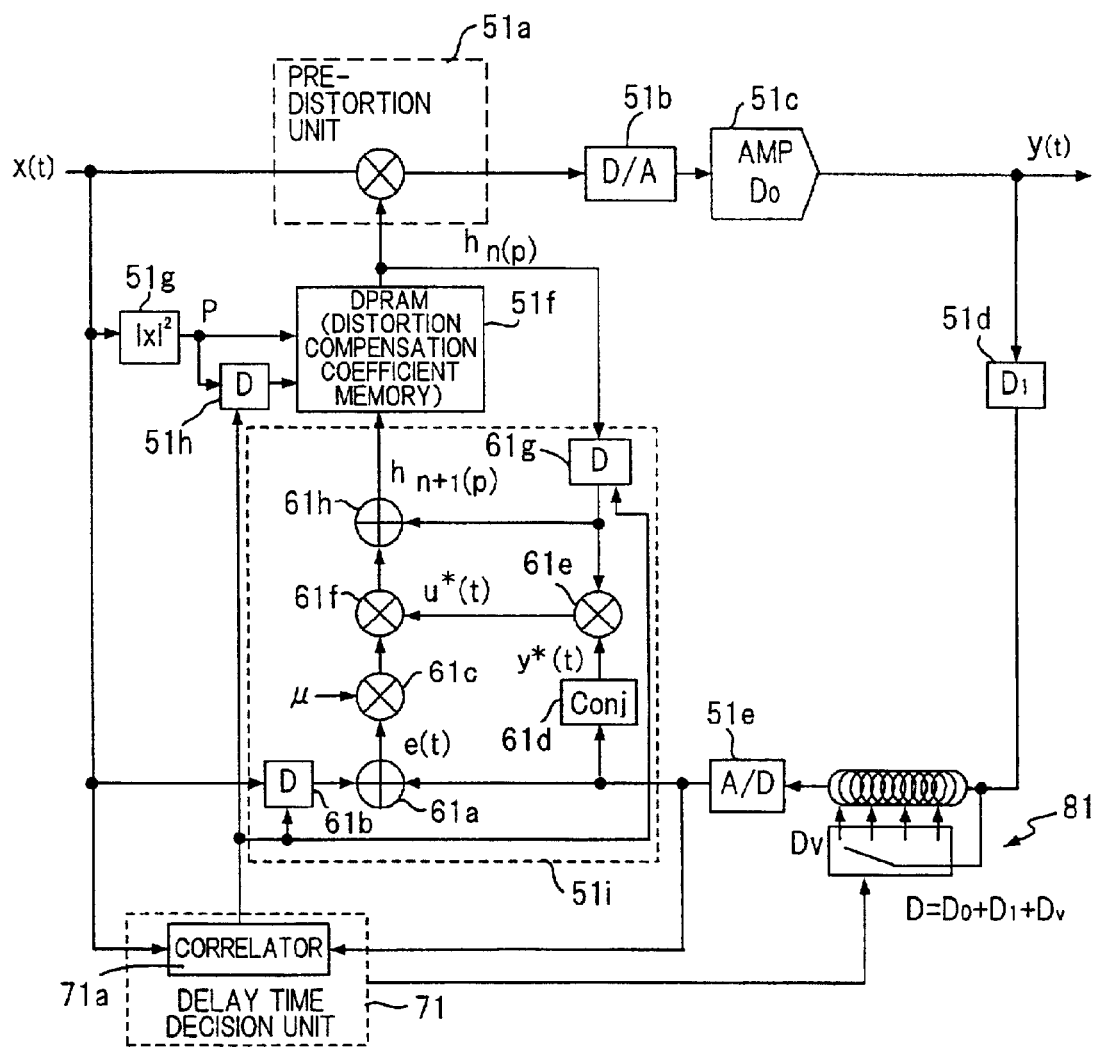
FIG. 2 is a schematic explanatory view of a second present invention.

FIG. 2 is a schematic explanatory view of a second present invention. The same reference numerals are provided for the elements which are the same as those shown in FIG. 1. The second invention is different from the first one in that a delay unit 81 for controlling the amount Dv of delay of a feedback signal at interval of time shorter than the sampling period of a transmission signal x(t) is inserted into a feedback loop.

The delay time decision unit 71 obtains a phase difference (time difference) in which the correlation is the maximum as the delay time $D(=D_0+D_1)$ at interval of the sampling period while the amount of delay in the delay unit 81 is kept constant, and then adjusts the amount Dv of delay in the delay unit 81 in such a manner that the correlation is the maximum while the time difference between the transmission signal and the feedback signal in the correlator 71a is set at the said obtained time D. Thereafter, the decided delay time D+Dv is set in each of the delay circuits 51h, 61b and 61g so as to adjust the timings.

Alternatively, the delay time decision unit 71 obtains a time difference in which the correlation between a transmission signal and a feedback signal is the maximum as the delay time $D(=D_0+D_1)$ at intervals of the sampling period while the amount of delay in the delay unit 81 is kept constant, and sets the delay time D in each of the delay circuits 51*h*, 61*b* and 61*g*. In this manner, it is possible to eliminate the delay in the unit of sampling period. The delay time decision unit 71 then (1) fixes the time difference between a transmission signal and a feedback signal in the correlator 71*a* at 0, and varies the amount Dv of delay which is smaller than the sampling period in the delay unit 81 in such a manner that the correlation is the maximum. In this manner, it is possible to adjust the amount of delay which is smaller than the sampling period.

According to this delay unit 81, it is possible to adjust the total delay time $D=D_0+D_1+Dv$ to be an integral multiple of the sampling period. In addition, the adjustment of the timing of each part of the distortion compensating apparatus with high precision is enabled by adjusting the delay time in the delay unit 81.

The delay unit 81 can be constituted by any of (1) a delay element, (2) an analog filter, (3) a digital filter, (4) a sampling clock phase variable circuit of an AD converter, or the like.

(B) Delay Time Decision Unit Using a Sliding Correlator (a) First Embodiment

Figure 3:
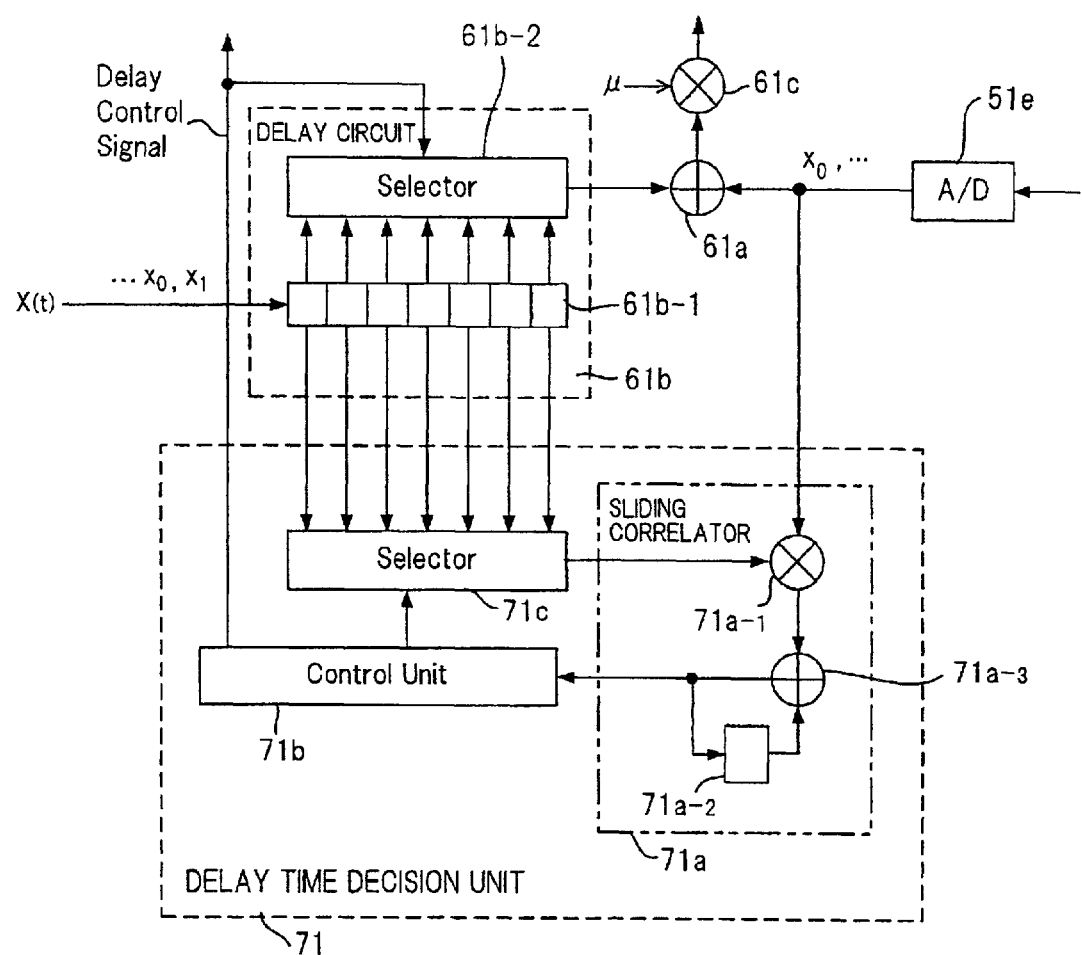
FIG. 3 shows the structure of a first embodiment of a delay time decision unit using a sliding correlator.

FIG. 3 shows the structure of a first embodiment of a delay time decision unit using a sliding correlator. The same reference numerals are provided for the elements which are the same as those shown in FIG. 1. The delay circuit 61*b* is provided with a shift register 61*b*-1 for sequentially shifting and storing digital transmission signals x(t) which are sent at interval of the sampling period, and a selector 61*b*-2 for taking a transmission signal out of a predetermined position of the shift register 61*b*-1 and inputting it into the subtracter 61*a*. The shift length of the shift register 61*b*-1 is set at a length longer than the maximum delay time, and a transmission signal is delayed by m·Ts (Ts is a sampling period) at an m-th shift position from the head. The delay time decision unit 71 is provided with a sliding correlator 71*a*, a control unit 71*b*, and a selector 71*c*. The sliding correlator 71*a* multiplies the transmission signals x(t) delayed by a predetermined time by feedback signals y(t) output from the AD converter 51*e*, sample by sample, and accumulates the results of the multiplications, there by the correlation is computed. The sliding correlator 71*a* is constituted by a multiplier 71*a*-1, a delayer 71*a*-2, and an adder 71*a*-3 for adding a new result of multiplication to the existing accumulated value and outputting the sum. The selector 71*c* controls the phase difference (time difference) between a transmission signal x(t) and a feedback signal by switching the shift position of the shift register 61*b*-1 of which the transmission signal x(t) is taken out. The control unit 71*b* obtains the delay time at which the correlation is the maximum and sets the delay time obtained in the selector 61*b*-2.

Figure 4:
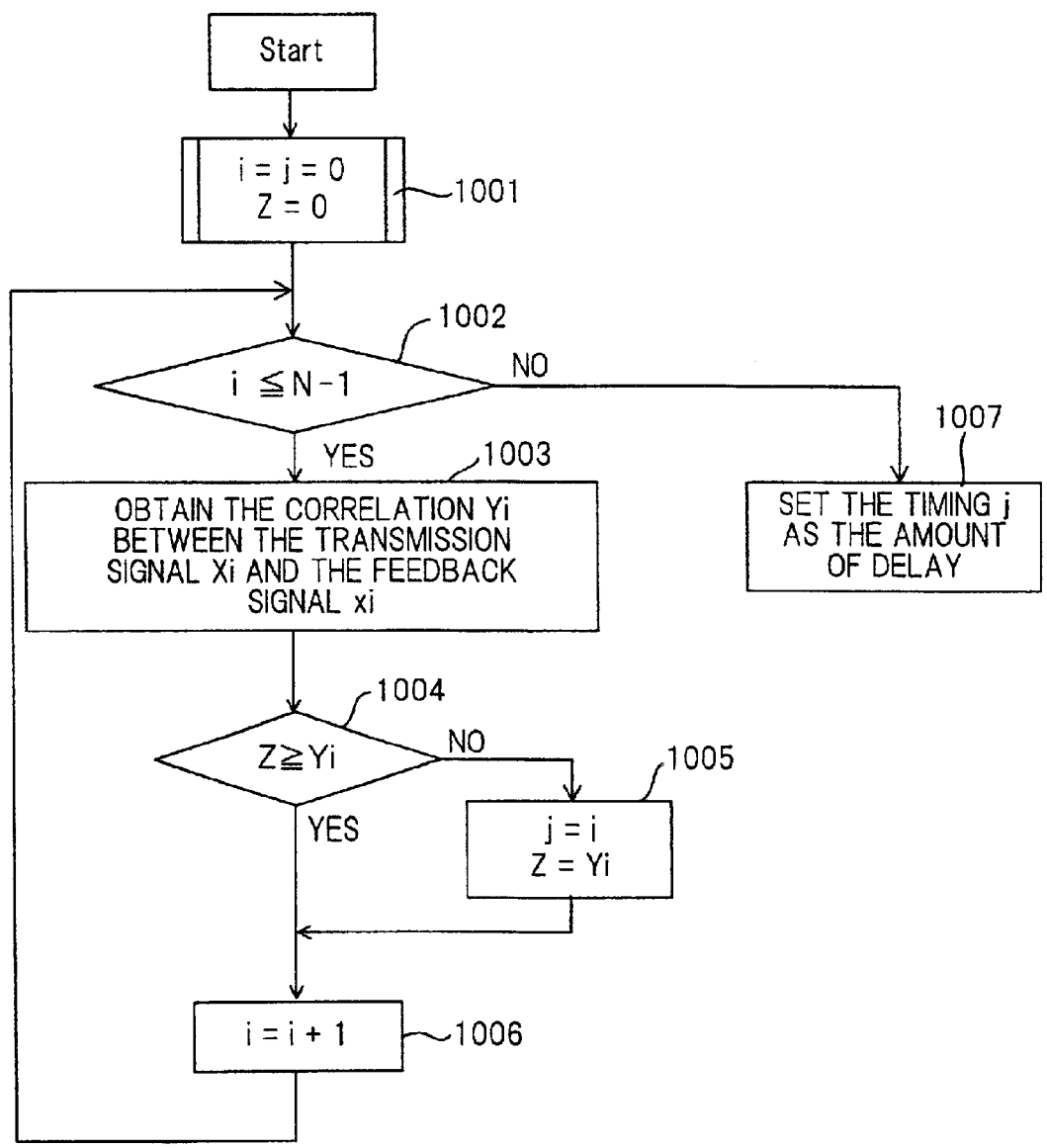
FIG. 4 is a flowchart of the delay time decision processing of the delay time decision unit shown in FIG. 3.

FIG. 4 is a flowchart of the delay time decision processing of the control unit 71*b*. In FIG. 4, the symbol i denotes a parameter in the delay time i·Tc, j a parameter in the delay time j·Tc in which the correlation is the maximum for the present, Z the maximum correlation for the present, Yi the current correlation, and N is the known number of correlations to be computed.

At the beginning, i, j, and Z are initialized (step 1001). Then, whether the condition $i \leq N-1$ holds or not is checked. In other words, whether N number of correlations have been calculated or not is checked (step 1002). If the calculation of N number of correlations has not been finished, the correlation Yi between a transmission signal delayed by the time i·Tc (the transmission signal taken out of the i-th shift position of the shift register 61*b*-1) and a feedback signal is calculated by the sliding correlator 71*a* (step 1003).

The maximum correlation Z for the present is then compared with the current correlation Yi (step 1004), and if Z<Yi, the maximum correlation Z is updated as Z=Yi, and i is set as j (step 1005). Thereafter, or, if $Z \geq Yi$ at step 1004, i is proceeded by one (i=i+1) (step 1006), and the processing at step 1002 and thereafter is repeated. If $i \geq N$ at step 1002 when the calculation of N number of correlations is finished, the time j·Tc is set in the delay circuit 61*b* as the total delay time in the transmission power amplifier and the feedback system (step 1007). The selector 61*b*-2 of the delay circuit 61*b* takes a transmission signal out of the j-th shift position of the shift register 61*b*-1 and inputs it into the subtracter 61*a*. Additionally, each of the delay circuits 51*h*, 61*g* (FIG. 1) has a similar structure, and takes a transmission signal delayed by the time j·Tc out of the j-th shift position of a shift register and outputs it.

In this manner, it is possible to decide the total delay time in the transmission power amplifier and the feedback system by obtaining the phase difference in which the correlation between a transmission signal and a feedback signal is the maximum and, in addition, to simplify the structure of the delay time decision unit 71 by using a sliding correlator as the correlator.

(a) Second Embodiment

Figure 5:
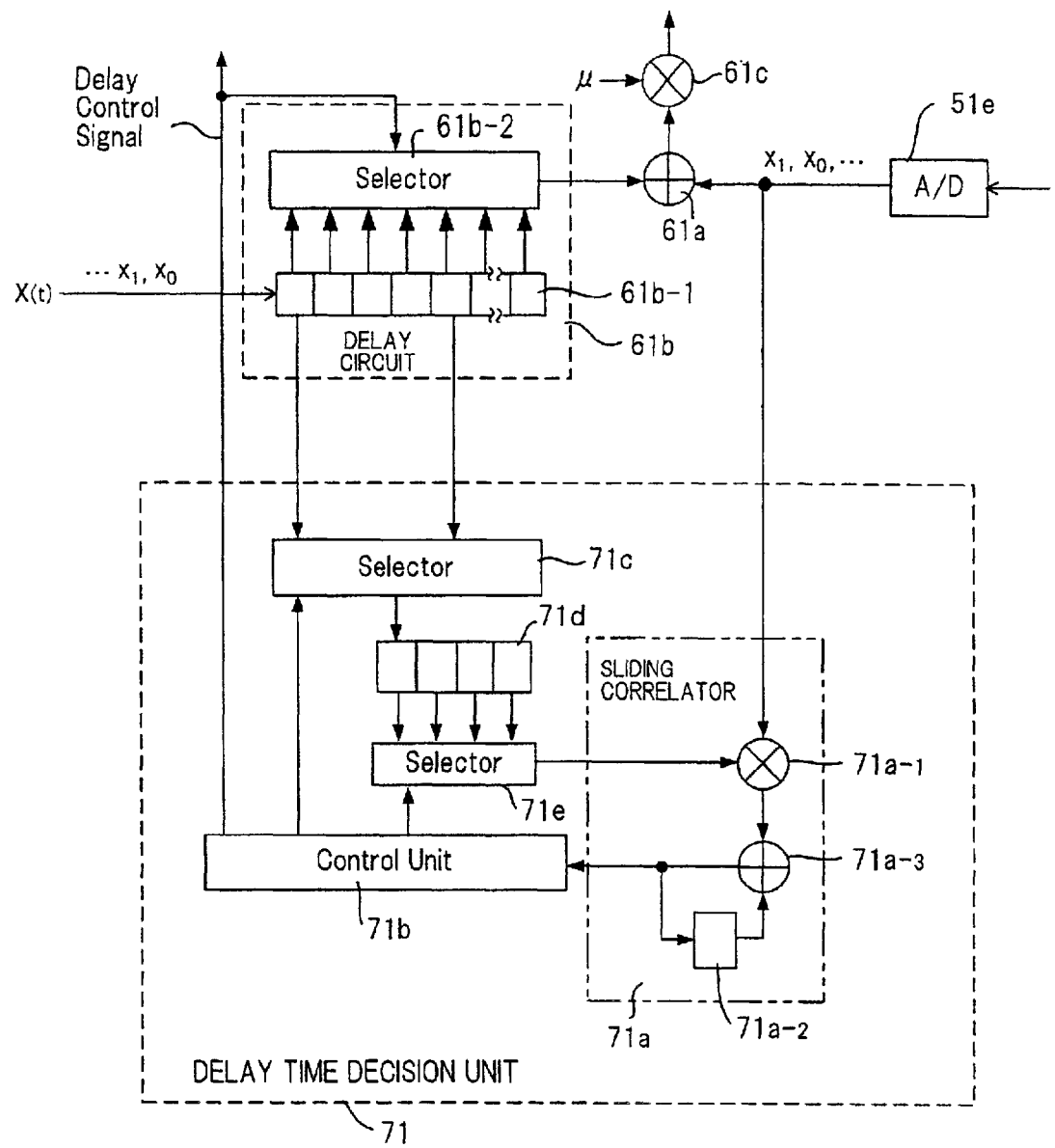
FIG. 5 shows the structure of a second embodiment of a delay time decision unit using a sliding correlator.

FIG. 5 shows the structure of a second embodiment of a delay time decision unit using a sliding correlator. The same reference numerals are provided for the elements which are the same as those shown in FIG. 3. This embodiment is different in function from the first example shown in FIG. 3 in the following points:

(1) that a transmission signal x(t) is M oversampled;

(2) that correlations are obtained while the phase difference (time difference) between a transmission signal and a feedback is sequentially shifted at interval of M-oversampling period (=M×oversampling period) and that the phase difference in the unit of the M-oversampling period in which the correlation is the maximum is obtained; and (3) that the correlations in the vicinity of the phase difference obtained are obtained while the phase difference is sequentially shifted at interval of the oversampling period, and the delay time is decided on the basis of the phase difference in which the correlation is the maximum.

This example is different in hardware in the following points:

(1) that the length of the shift register 61*b*-1 of the delay circuit 61*b* is M times as long as that in the first example;

(2) that a second selector 71*e* and an M-bit shift register 71*d* are provided in the delay time decision unit 71;

(3) that in the first stage where the correlation is calculated at interval of M·oversampling period, the selector 71*c* shifts the position of the shift register 61*b*-1 of which a transmission signal is taken out, by m bits whenever a correlation is calculated, and takes out the transmission signal and inputs it into the shift register 71*d*;

(4) that in the first stage where the correlation is calculated at interval of M·oversampling period, the selector 71*e* constantly takes a transmission signal out of the first shift position of the shift register 71*d*, and inputs the transmission signal into the sliding correlator 71*a*;

(5) that in the second stage where the correlation is calculated at interval of the oversampling period, the selector 71*c* takes a transmission signal out of the shift position of the shift register 61*b*-1 where the correlation is the maximum at interval of M-oversampling period, and inputs the transmission signal into the shift register 71*d* every oversampling period; and (6) that in the second stage where the correlation is calculated at interval of the oversampling period, the selector 71*e* selectively takes a transmission signal out of the next shift position of the shift register 71*d* whenever a correlation is calculated, and inputs the transmission signal into the sliding correlator 71*a*.

Figure 6:
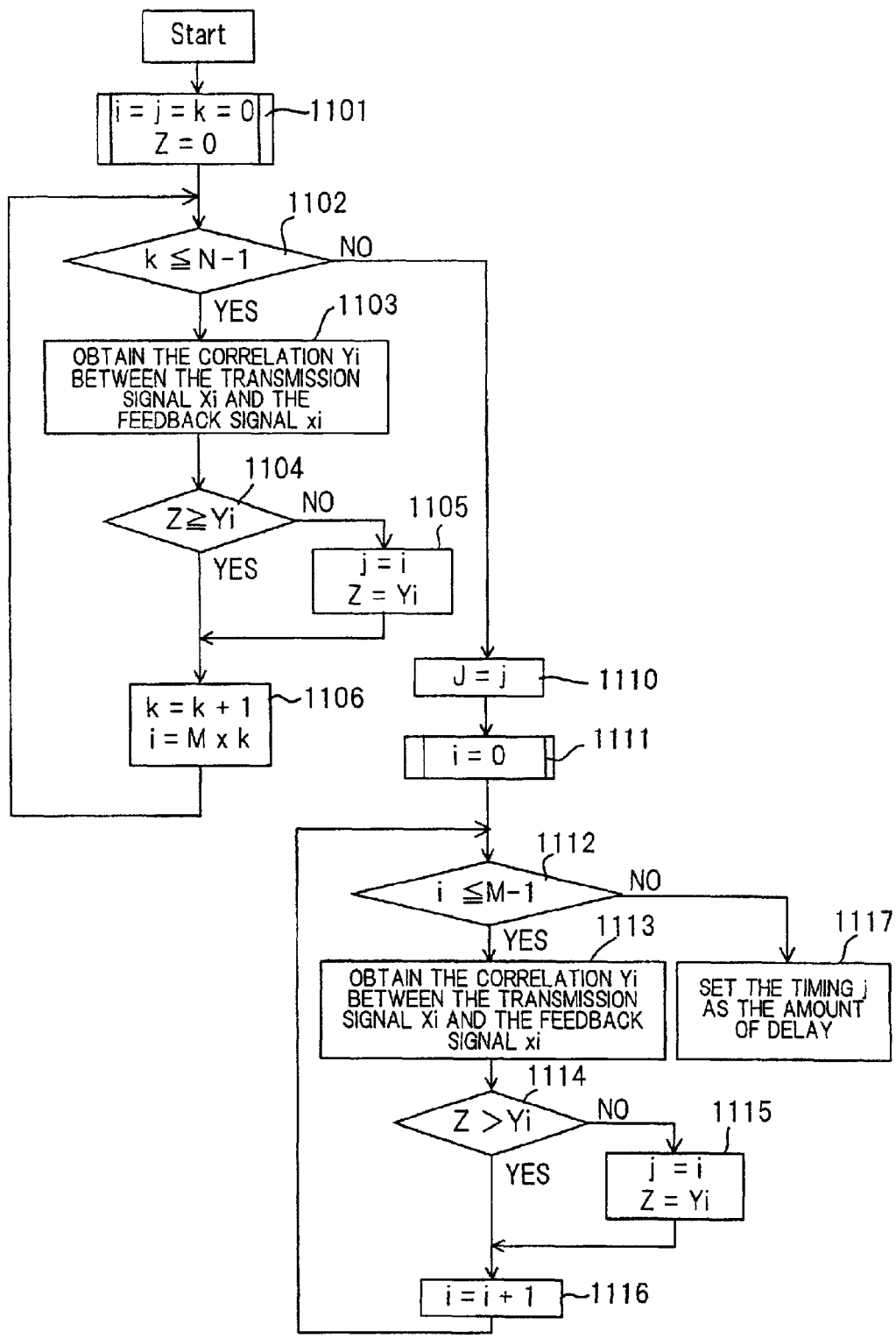
FIG. 6 is a flowchart of the delay time decision processing of the delay time decision unit shown in FIG. 5.

FIG. 6 is a flowchart of the delay time decision processing of the control unit 71*b*. In FIG. 6, the symbol i denotes a parameter in the delay time i·Ts on the assumption that Ts is the oversampling period, j a parameter in the delay time j·Ts in which the correlation is the maximum for the present, M the number of oversampling, k the number of the computed correlations which satisfies a parameter obtained from i=M·k, Z the maximum correlation for the present, Yi the current correlation, and N is the known number of correlations to be computed.

At the time of initiation, i, j, k and Z are initialized (step 1101). Then, whether the condition k≦N−1 holds or not is checked. In other words, whether the calculation of N number of correlations at interval of M-oversampling period has been finished or not is checked (step 1102). If the calculation has not been finished, the correlation Yi between a transmission signal delayed by the time i·Tc (the transmission signal taken out of the i-th shift position of the shift register 61*b*-1) and a feedback signal is calculated by the sliding correlator 71*a* (step 1103).

The maximum correlation Z for the present is then compared with the current correlation Yi (step 1104), and if Z<Yi, the maximum correlation Z is updated as Z=Yi, and i is set as j (step 1105). Thereafter, or, if Z≧Yi at step 1104, k is proceeded by one (k=k+1), and i is updated as i=k·M (step 1106), and the processing at step 1102 and thereafter is repeated. If k>N at step 1102 when the calculation of N number of correlations at interval of M·oversampling period at the first stage is finished, J is set as j (step 1110). The symbol J·Ts is the delay time in which the maximum correlation is obtained in the first stage. The selector 71*c* then takes the transmission signal out of the J-th shift position of the shift register 61*b*-1 and inputs it into the shift register 71*d* every oversampling period.

Thereafter, i is set at 0 (step 1111), and whether i≦M−1 or not is checked. In other words, whether the calculation of M number of correlations at interval of the oversampling period (calculation at the second stage) has been finished or not is checked (step 1112). If the calculation has not been finished, the correlation Yi between a transmission signal delayed by the time (J+i)·Ts (the transmission signal taken out of the i-th shift position of the shift register 71*d*) and a feedback signal is calculated by the sliding correlator 71*a* (step 1113).

The maximum correlation Z for the present is then compared with the current correlation Yi (step 1114), and if Z<Yi, the maximum correlation Z is updated as Z=Yi, and j is set as i (step 1115). Thereafter, or, if Z≧Yi at step 1114, i is proceeded by one (step 1116), and the processing at step 1112 and thereafter is repeated. If i=M at step 1112 when the calculation of M number of correlations at the second stage is finished, the time (J+j)·Tc is set in the delay circuit 61*b* as the total delay time in the transmission power amplifier and the feedback system (step 1117). The selector 61*b*-2 of the delay circuit 61*b* takes a transmission signal out of the (J+j)-th shift position of the shift register 61*b*-1 and inputs it into the subtracter 61*a*. Additionally, each of the delay circuits 51*h*, 61*g* (FIG. 1) has a similar structure, and takes a transmission signal delayed by the time (J+j)·Tc out of the (J+j)-th shift position of a shift register and outputs it.

In this manner, it is possible to obtain the delay time, by calculating {N+M} correlations without the need for calculating N·M correlations, so that it is possible to shorten the time required for the decision of the delay time.

(C) Delay Time Decision Unit Using a Matched Filter (a) First Embodiment

Figure 7:
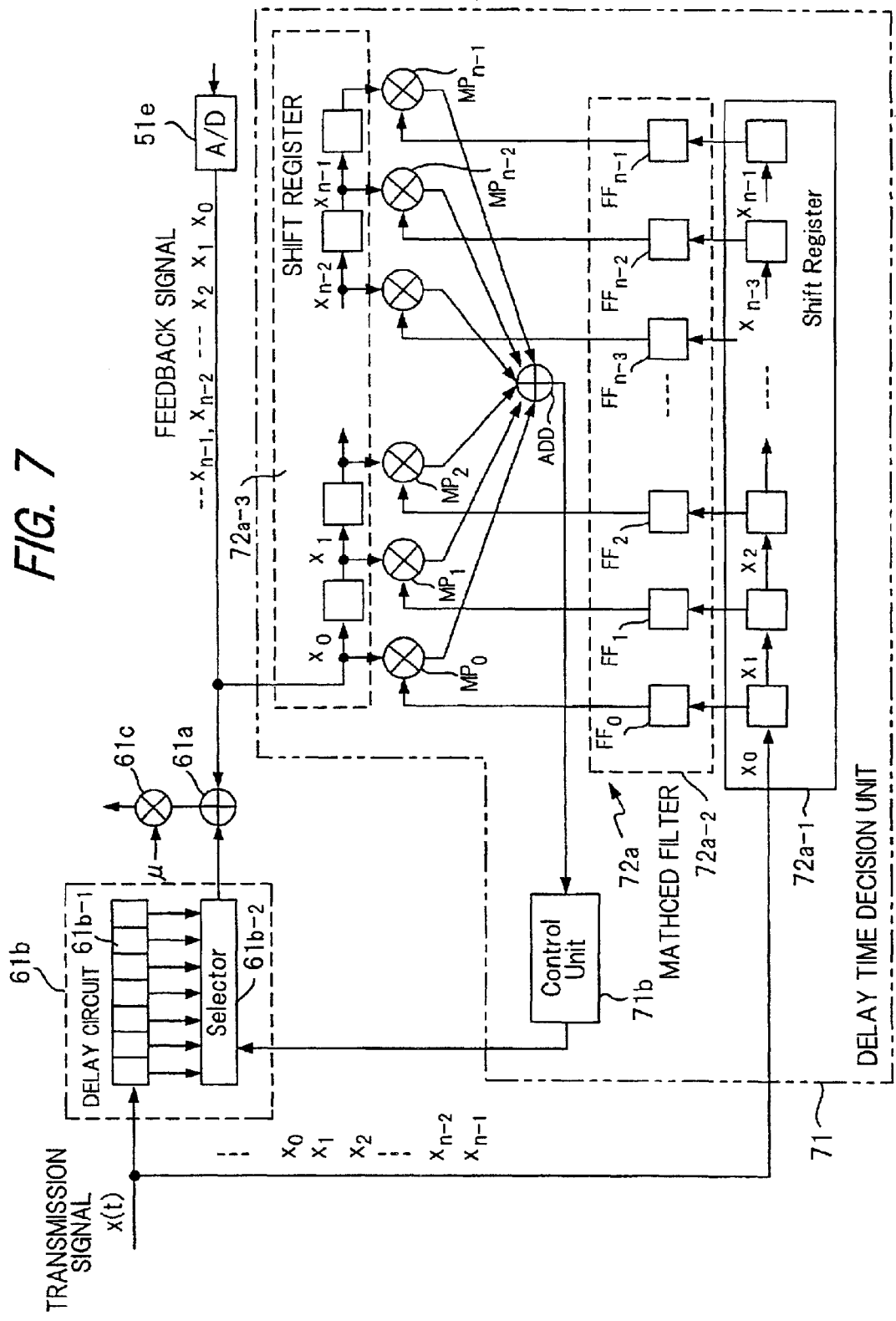
FIG. 7 shows the structure of a first embodiment of a delay time decision unit using a matched filter.

FIG. 7 shows the structure of a first embodiment of a delay time decision unit using a matched filter. The same reference numerals are provided for the elements which are the same as those shown in FIG. 3. The delay circuit 61*b* is provided with the shift register 61*b*-1 for sequentially shifting transmission signals x(t) which reach at a predetermined sampling rate and storing them, and the selector 61*b*-2 for taking a transmission signal from a predetermined shift position of the shift register 61*b*-1 and inputting it into the subtracter 61*a*. The shift length of the shift register 61*b*-1 is set to be longer than the maximum delay time, and a transmission signal delays by m·Ts (Ts is a sampling rate) at the m-th shift position from the head.

The delay time decision unit 71 is provided with a matched filter 72*a* and the control unit 71*b*. The matched filter 72*a* is composed of a shift register 72*a*-1 having a shift length n for shifting and storing n samples of digital transmission signals x(t), a latch circuit 72*a*-2 for n samples which is loaded with the contents of the shift register 72*a*-1 at a predetermined time, and which holds the contents, a shift register 72*a*-3 having a shift length n for shifting and storing n samples of digital feedback signals, n multipliers $MP_0$ to $MP_{n-1}$ for multiplying the corresponding sample data in the latch circuit 72*a*-2 and the shift register 72*a*-3, and an adder ADD for adding the output of each multiplier.

It is possible to calculate a correlation by multiplying data of the n sample data latched in the latch circuit 72*a*-2 by the corresponding data of the n sample data in the shift register 72*a*-3 one by one, and adding the n products. The contents of the shift register 72*a*-3 have been shifted by the next sampling period. It is possible to calculate a correlation delayed by one sampling period by multiplying the n sample data latched in the latch circuit 72*a*-2 by the corresponding one of the n sample data in the shift register 72*a*-3 one by one, and adding the n products. By repeating a similar calculation thereafter, it is possible to obtain n correlations from the delay times 0 to (n·1)·Ts in the course of n sampling periods. The control unit 71*b* obtains the maximum of the n correlations, and sets the delay time j·Ts which the maximum correlation is generated in the delay circuit 61*b* as the total delay time in the transmission power amplifier and the feedback system. Then, the selector 61*b*-2 of the delay circuit 61*b* takes a transmission signal out of the j-th position of the shift register 61*b*-1 and inputs it into the subtracter 61*a*. Each of the delay circuits 5l*h*, 61*g* (FIG. 1) has a similar structure, and takes a signal delayed by the time j·Ts out of the j-th position of a shift register.

In this manner, it is possible to determine the total delay time in the transmission power amplifier and the feedback system by obtaining the phase difference (time difference) in which the correlation between a transmission signal and a feedback signal is the maximum and, in addition, to shorten the time required for the decision by using a matched filter as the correlator.

(b) Second Embodiment

Figure 8:
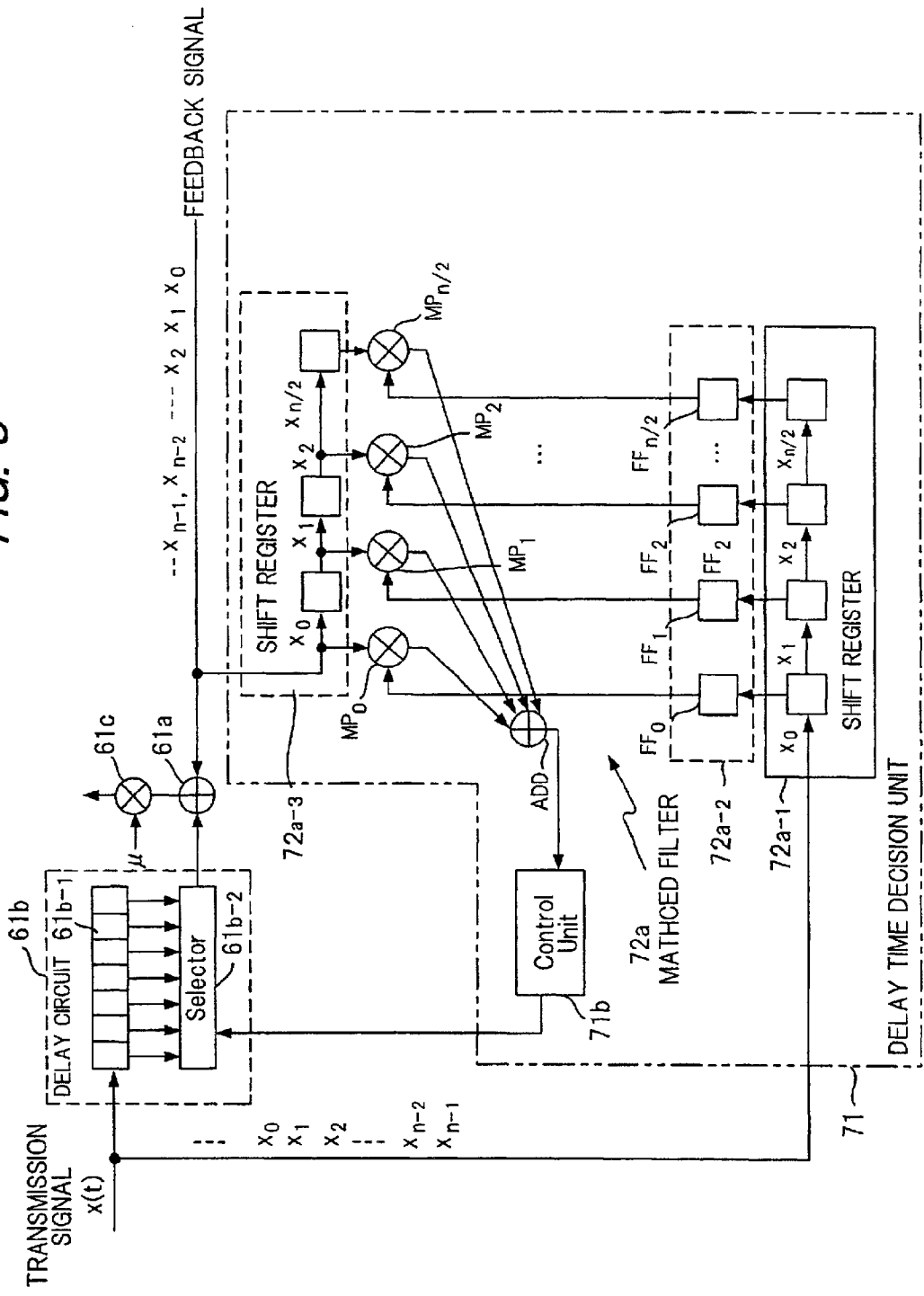
FIG. 8 shows the structure of a second embodiment of a delay time decision unit using a matched filter.

FIG. 8 shows a second embodiment of a delay time decision unit using a matched filter. The same reference numerals are provided for the elements which are the same as those shown in FIG. 7. This example is different from the first example in the following points:

(1) that the length of the matched filter, in other words, the length of the shift registers 72a-1, 72a-3 and the latch circuit 72a-2 is made shorter than (e.g., half the total amount of delay time which is caused in the transmission power amplifier and the feedback loop, and that the number of multipliers is reduced to half; and (2) that the transmission signals x(t) are divided into the former half and the latter half, that n/2 correlations are calculated for the former and latter halves, and that the delay time is decided on the basis of the timing for generating the maximum correlation.

The matched filter 72a latches the former n/2 transmission signals x(t) stored in the shift register 72a-1 in the latch circuit 72a-2, multiplies the latched former n/2 transmission signals by the corresponding n/2 feedback signals stored in the shift register 72a-3, one by one, adds the products, and inputs the sum into the control unit 71b as the correlation. Thereafter, whenever the contents of the shift register 72a-3 are shifted, the matched filter 72a calculates a correlation between the former half data of the latched transmission signals and the corresponding feedback signals, and inputs it into the control unit 71.

While the contents of the shift register 72a-3 are shifted (n/2) times, and the n/2 correlations between the former transmission signals and the feedback signals are calculated, the shift register 72a-1 stores the latter n/2 transmission signals x(t). The matched filter 72a latches the latter n/2 transmission signals x(t) stored in the shift register 72a-1 in the latch circuit 72a-2, multiplies the latched latter n/2 transmission signals by the corresponding feedback signals stored in the shift register 72a-3, one by one, adds the products, and inputs the sum into the control unit 71b. Thereafter, whenever the contents of the shift register 72a-3 are shifted, the matched filter 72a calculates a correlation between the latter half data of the latched transmission signals and the corresponding feedback signal, and inputs it into the control unit 71b.

When the contents of the shift register 72a-3 are shifted n/2 times and the calculation of the n/2 correlations between the latter half transmission signals and the feedback signals is finished, the control unit 71b obtains the maximum from among the total n correlations, decides the delay time on the basis of the timing for generating the maximum correlation and sets the delay time in the delay circuit 61b. It is possible to determine the maximum correlation as follows. Whenever a correlation is input, the control unit 71b compares the correlation with the existing maximum correlation, and if the current correlation is larger, the control unit 71b stores its timing, updates the maximum correlation. By repeating this processing, the maximum correlation and its timing are determined.

In the above example, the length of the shift registers 72a-1, 72a-3 is reduced to half. It is possible to reduce it to ⅓, ¼, . . . instead. According to the second example using a matched filter, it is possible to shorten the length of the matched filter.

Figure 9:
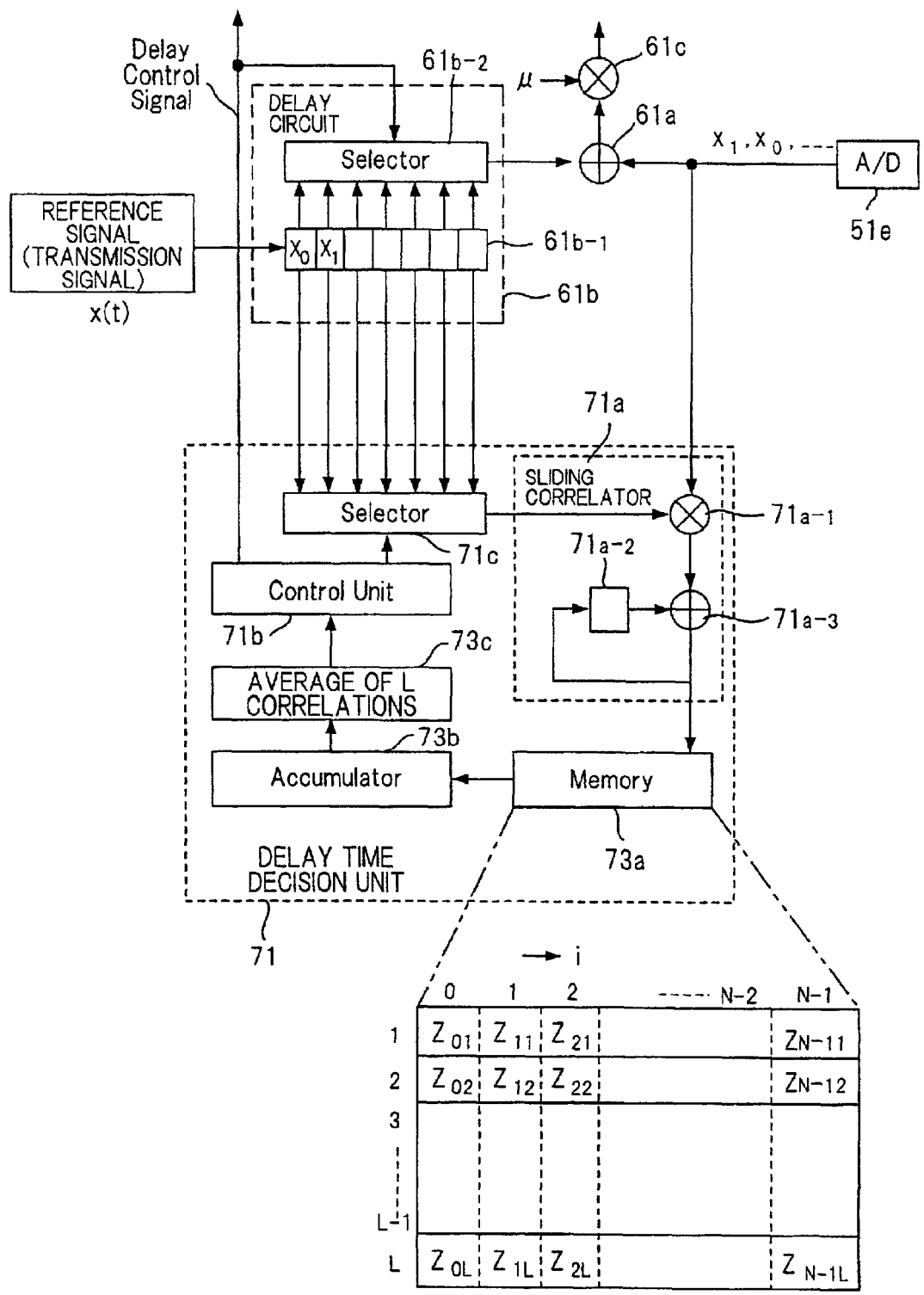
FIG. 9 shows the structure of a delay time decision unit for deciding a delay time on the basis of the maximum value of L average correlations.

(D) Delay Time Decision Unit for Deciding the Delay Time on the Basis of the Maximum of Average Correlations FIG. 9 shows the structure of a delay time decision unit for deciding the delay time on the basis of the maximum of L number of average correlations. The same reference numerals are provided for the elements which are the same as those in the embodiment using a sliding correlator shown in FIG. 3. This unit is different from the example shown in FIG. 3 in (1) that L sets of N number of correlations are obtained in the same way as in the example shown in FIG. 3, while setting the delay times at 0·Ts, 1·Ts, 2·Ts, . . . , (N−1)·Ts, and that there is provided a memory 73a for storing the respective correlations $Z_{0i}, Z_{1i}, Z_{2i}, \ldots, Z_{(N-1)i}$, (i=1~L), and (2) that there are provided an accumulator 73b and an average value arithmetic unit 73c for accumulating the corresponding correlations $Z_{j1}, Z_{j2}, Z_{j3}, \ldots, Z_{jL}$ (j=0~N−1), and obtaining the average value thereof.

The control unit 71b sets the delay time j·Ts at which the average correlation is the maximum in the selector 61b-2 of the delay circuit 61b as the total delay time in the transmission power amplifier, the feedback system, etc. The selector 61b-2 takes a transmission signal out of the j-th shift position of the shift register 61b-1 and inputs it into the subtracter 61a. In this manner, it is possible to determine the delay time with high precision and set it in each delay circuit.

In the example shown in FIG. 9, a sliding correlator is used. Alternatively, it is possible to use a matched filter so as to obtain L sets of N number of correlations, while setting the delay time at 0·Ts, 1·Ts, 2·Ts, . . . , (N−1)·Ts, and to determine the maximum average correlation as the delay time.

(E) Delay Time Decision Unit for Deciding and Setting the Delay Time with High Precision In the above-described examples, the delay time is decided in the unit of the sampling period Ts and set in a delay circuit. In contrast, in the following examples, the delay time is decided in the unit of the time which is shorter than the sampling period Ts, that is, the delay time is decided with high precision and set in a delay circuit.

(a) First Embodiment

Figure 10:
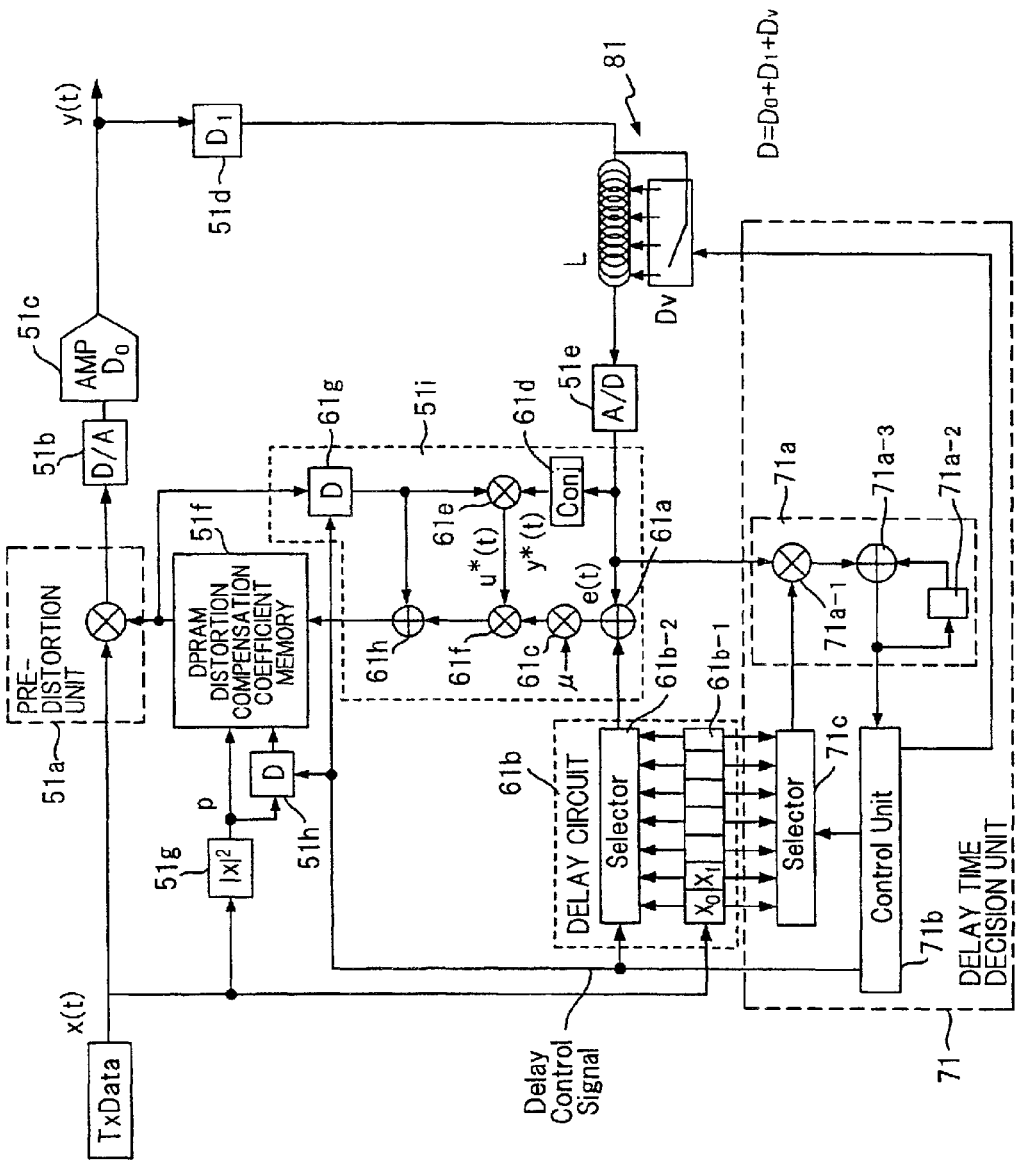
FIG. 10 shows the structure of a first embodiment of a delay time decision unit for deciding and setting a delay time with high precision.

FIG. 10 shows a first embodiment of a delay time decision unit for deciding the delay time with high precision. The same reference numerals are provided for the elements which are the same as those shown in FIG. 2. FIG. 10 is different from FIG. 2 in (1) that the detailed structure of the delay time decision unit 71 including the control unit 71b for adjusting the amount of delay in the delay unit 81 is shown, and (2) that the structure of the delay circuit 61b is shown in detail.

The first embodiment shown in FIG. 10 is remarkable for the delay unit 81 which is inserted into the feedback loop so as to control the amount Dv of delay at interval of time shorter than the sampling period Ts of a transmission signal x(t) in such a manner that the correlation is the maximum.

The delay circuit 61b is provided with the shift register 61b-1 for sequentially shifting and storing digital transmission signals x(t) which reach at intervals of the sampling period, and the selector 61b-2 for taking a transmission signal out of a predetermined shift position of the shift register 61b-1 and inputting it into the subtracter 61a. The shift length of the shift register 61b-1 is set at a length longer than the maximum delay time, and a transmission signal is delayed by m·Ts (Ts is the sampling period) at an m-th shift position from the head.

The delay time decision unit 71 is provided with the sliding correlator 71a, the control unit 71b, and the selector 71c. The sliding correlator 71a multiplies digital transmission signals x(t) which are delayed by a predetermined time by digital feedback signals y(t) output from the AD converter 51e, sample by sample, and accumulates integrates the results of the multiplications. The sliding correlator 71a is constituted by the multiplier 71a-1, the delayer 71a-2, and the adder 71a-3 for adding the existing accumulated value and a new result of multiplication and outputting the sum. The selector 71c controls the phase difference(time difference) between a transmission signal x(t) and a feedback signal by switching the shift position of the shift register 61*b*-1 of which the transmission signal x(t) is taken out. The control unit 71*b* obtains the delay time D at which the correlation is the maximum and sets the delay time obtained in the selector 61*b*-2. The control unit 71*b* also adjusts the amount Dv of delay in the delay unit 81 after the decision of the delay time D in such a manner that the correlation is the maximum.

Figure 11:
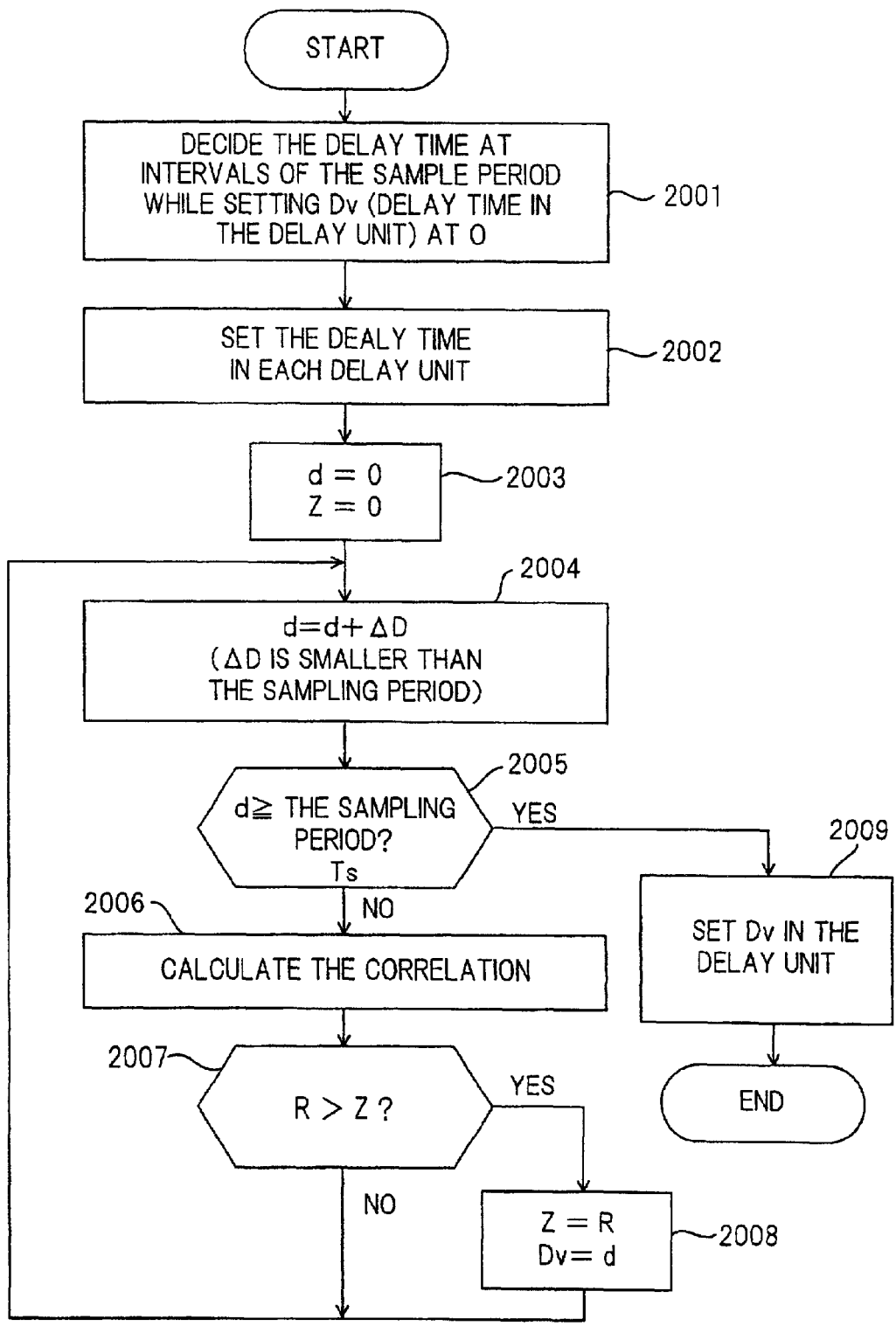
FIG. 11 is a flowchart of a process for setting a delay time with high precision at a time shorter than the sampling period.

FIG. 11 is a flowchart of a process for setting the delay time with high precision at a time shorter than the sampling period.

The delay time decision unit 71 obtains the time difference D in which the correlation is the maximum while the amount Dv of delay in the delay unit 81 is kept constant (e.g., Dv=0) (step 2001), and sets the delay time D in the delay circuits 51*h*, 61*b* and 61*g* (step 2002). In this manner, it is possible to eliminate the time difference at intervals of the sampling period. Here, it is possible to obtain the delay time D in which the correlation is the maximum in the same way as in the example shown in FIG. 3.

The delay time decision unit 71 then fixes the phase difference (time difference) between a transmission signal and a feedback signal in the correlator 71*a* at 0, and sets both d and Z at 0 (step 2003), wherein the symbol d is the amount of delay set in the delay unit 81, and Z the maximum correlation.

After the initiation, the amount of delay d is increased by ΔD (step 2004) and whether d exceeds the sampling period Ts or not is checked (step 2005), provided that ΔD is smaller than the sampling period Ts.

If d<Ts, the correlation R between a transmission signal and a feedback signal in the correlator 71*a* is calculated while the phase difference (time difference) between both signals is set at 0 (step 2006), and whether R>Z or not is checked (step 2007). If R≦Z, the process is returned to step 2004, the amount of delay d is increased by ΔD, and the processing thereafter is repeated.

On the other hand, if R>Z, both z and Dv are updated by Z=R and Dv=d (step 2008). The process is then returned to step 2004, the amount of delay d is increased by ΔD, and the processing thereafter is repeated.

If d≧Ts at step 2005 after repeating the above-described processing, Dv is set in the delay unit 81 (step 2009).

In this manner, by adjusting the amount Dv of delay, it is possible to obtain the total delay time $(D_0+D_1+Dv)$ of an integral multiple of the sampling period, thereby enabling the adjustment of timing of each part of the distortion compensating apparatus with high precision.

Although the amount Dv of delay is decided in the above example after the delay time D is set in the delay circuits, it is also possible to decide Dv without setting the delay time D in the delay circuits. In such a case, the phase difference (time difference) between a transmission signal and a feedback signal is fixed at D which is obtained at step 2001 and the correlation R is calculated at the step 2006, thereafter the amount d of delay in which the correlation R is the maximum is obtained and Dv is set at d. Finally, the delay time D is set in the delay circuits 51*h*, 61*b* and 61*g,* and the amount Dv of delay is set in the delay unit 81.

In the example shown in FIG. 10, a sliding correlator is adopted, but it is also possible to adopt a matched filter in place of the sliding correlator.

(b) Second Embodiment

Figure 12:
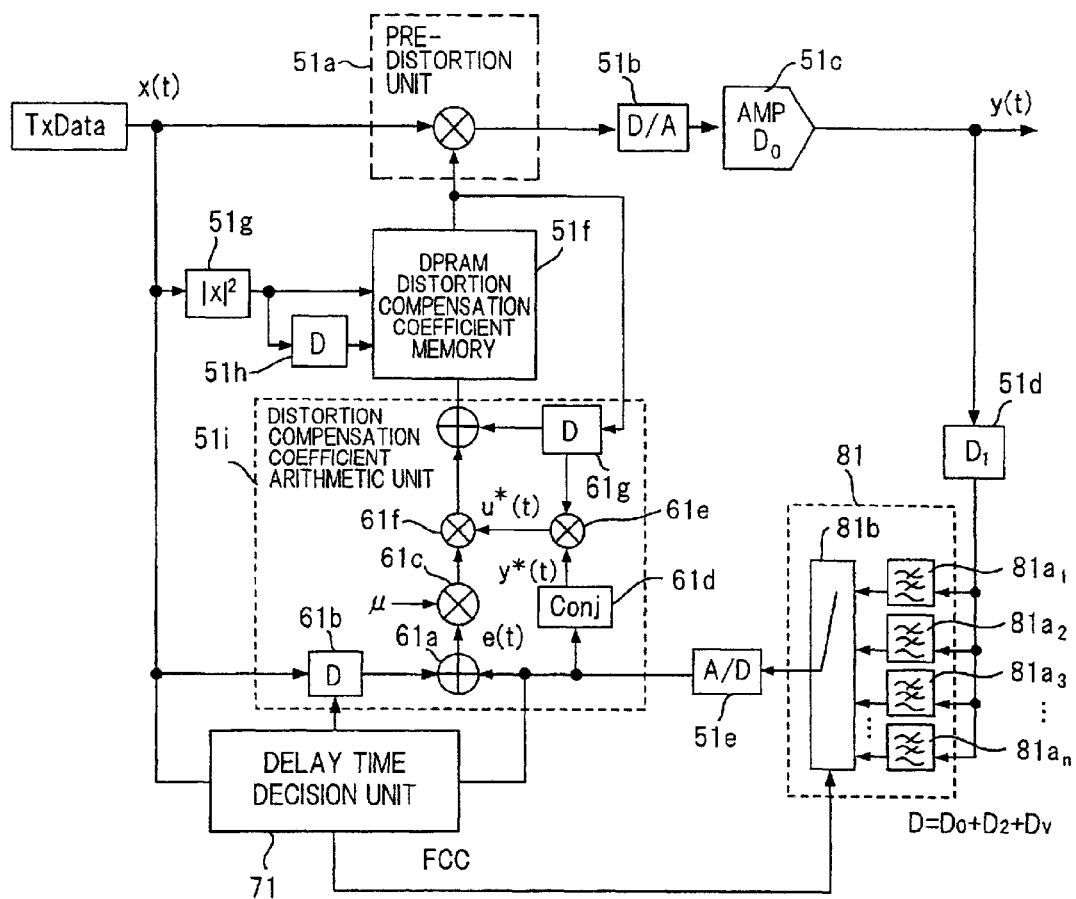
FIG. 12 shows the structure of a second embodiment of a delay time decision unit for deciding and setting a delay time with high precision.

FIG. 12 shows the structure of a second embodiment of a delay time decision unit for deciding the delay time with high precision. The same reference numerals are provided for the elements which are the same as those in the first embodiment. The second embodiment is different from the first embodiment in that the delay unit 81 is constituted by an analog filter. More specifically, the delay unit 81 is provided with a multiplicity of analog filters $81a_1$~$81a_n$ of which amounts of delay increase ΔD by ΔD in proportional to the suffix number and a selector 81*b* for selecting and outputting a feedback signal from among the feedback signals output from these analog filters. When the necessity of increasing the amount of delay by ΔD arises at step 2004 in FIG. 11, the delay time decision unit 71 inputs a filter switching signal FCC into the delay unit 81. The delay unit 81, which has received the filter switching signal FCC, switches analog filters to increase the amount of delay by ΔD.

(c) Third Embodiment

Figure 13:
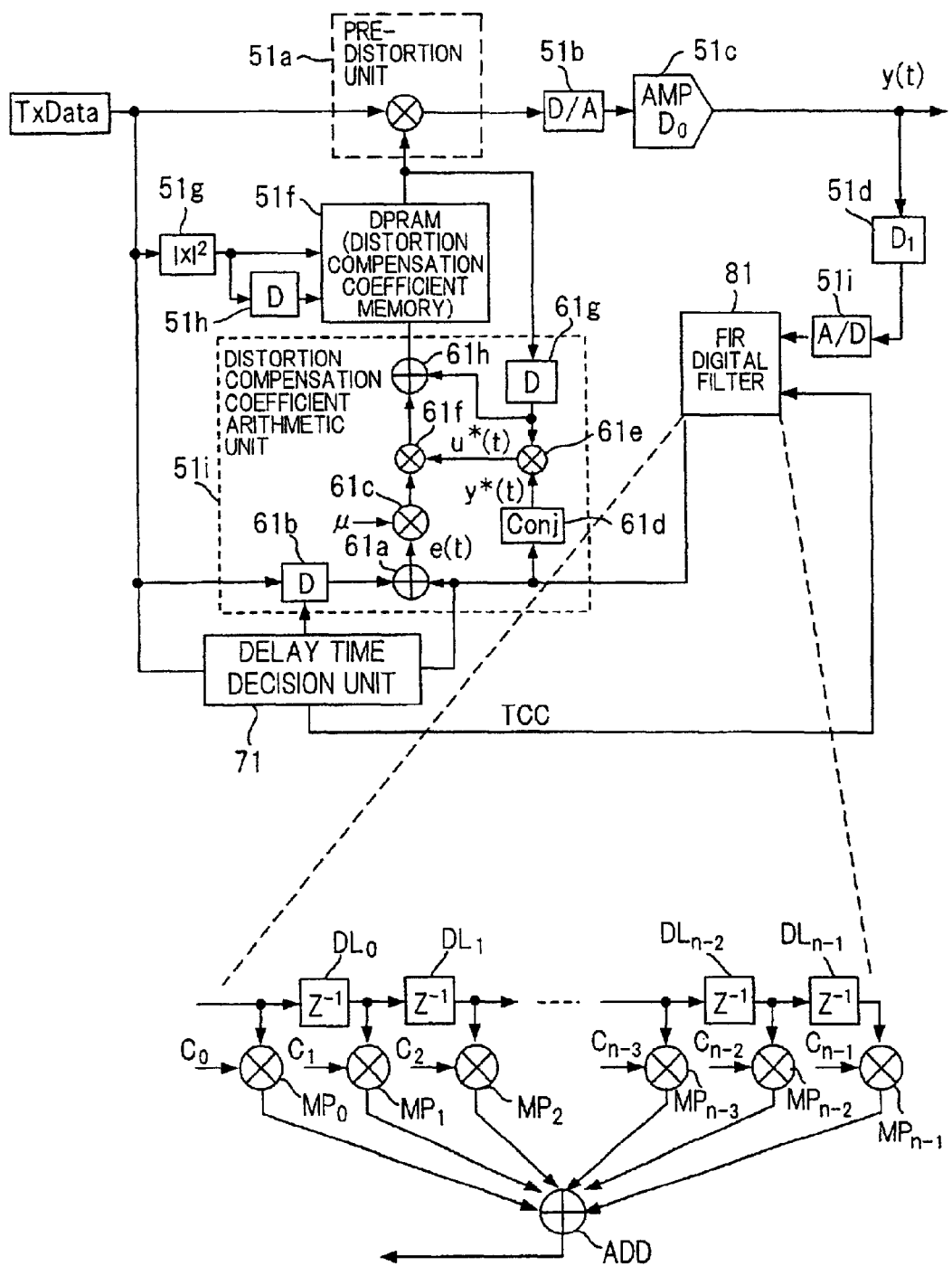
FIG. 13 shows the structure of a third embodiment of a delay time decision unit for deciding and setting a delay time with high precision.
Figure 14A:
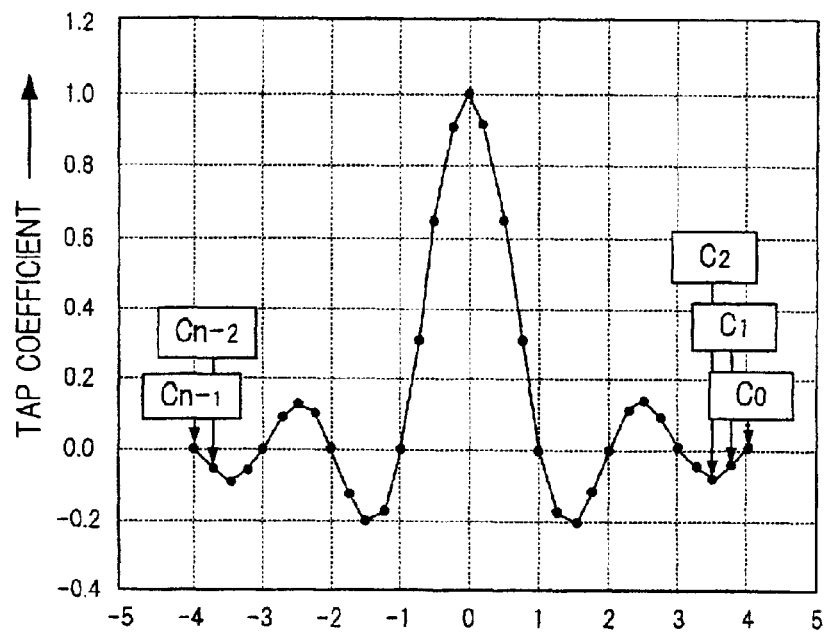
FIGS. 14A and 14B are explanatory views of the relationship between a delay time and a Tap coefficient.
Figure 14B:
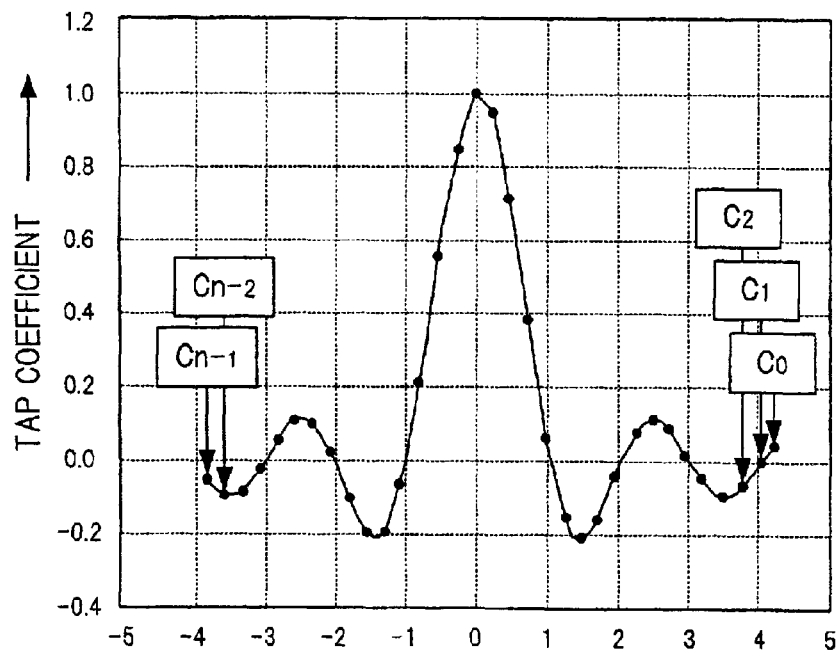

FIG. 13 shows the structure of a third embodiment of a delay time decision unit for deciding the delay time with high precision. The same reference numerals are provided for the elements which are the same as those in the first example. The third embodiment is different from the first embodiment in that the delay unit 81 is constituted by an FIR type digital filter. More specifically, the delay unit 81 is composed of n delay circuits $DL_0$~$DL_{n-1}$ which are cascaded to each other so as to sequentially delay the signals by the sampling period, n multipliers $MP_0$~$MP_{n-1}$ for multiplying the outputs of the respective delay circuits by respective Tap coefficients $C_0$~$C_{n-1}$, and an adder ADD for adding the output of each multiplier and outputting the sum. An FIR type digital filter is capable of adjusting the delay time by changing the Tap coefficient. FIG. 14A shows an example of Tap coefficients in the case in which a transmission signal is 4 oversampled, and FIG. 14B shows an example of the Tap coefficient in the case in which the phase is shifted by ¾ of the sampling period.

If there is a need for increasing the amount of delay by ΔD at step 2004 in FIG. 11, the delay time decision unit 71 inputs a Tap coefficient switching signal TCC into the delay unit 81 constituted by a digital filter. When the delay unit 81 receives the Tap coefficient switching signal TCC, it changes the Tap coefficients $C_0$~$C_{n-1}$, and increases the amount of delay by ΔD.

(d) Fourth Embodiment

Figure 15:
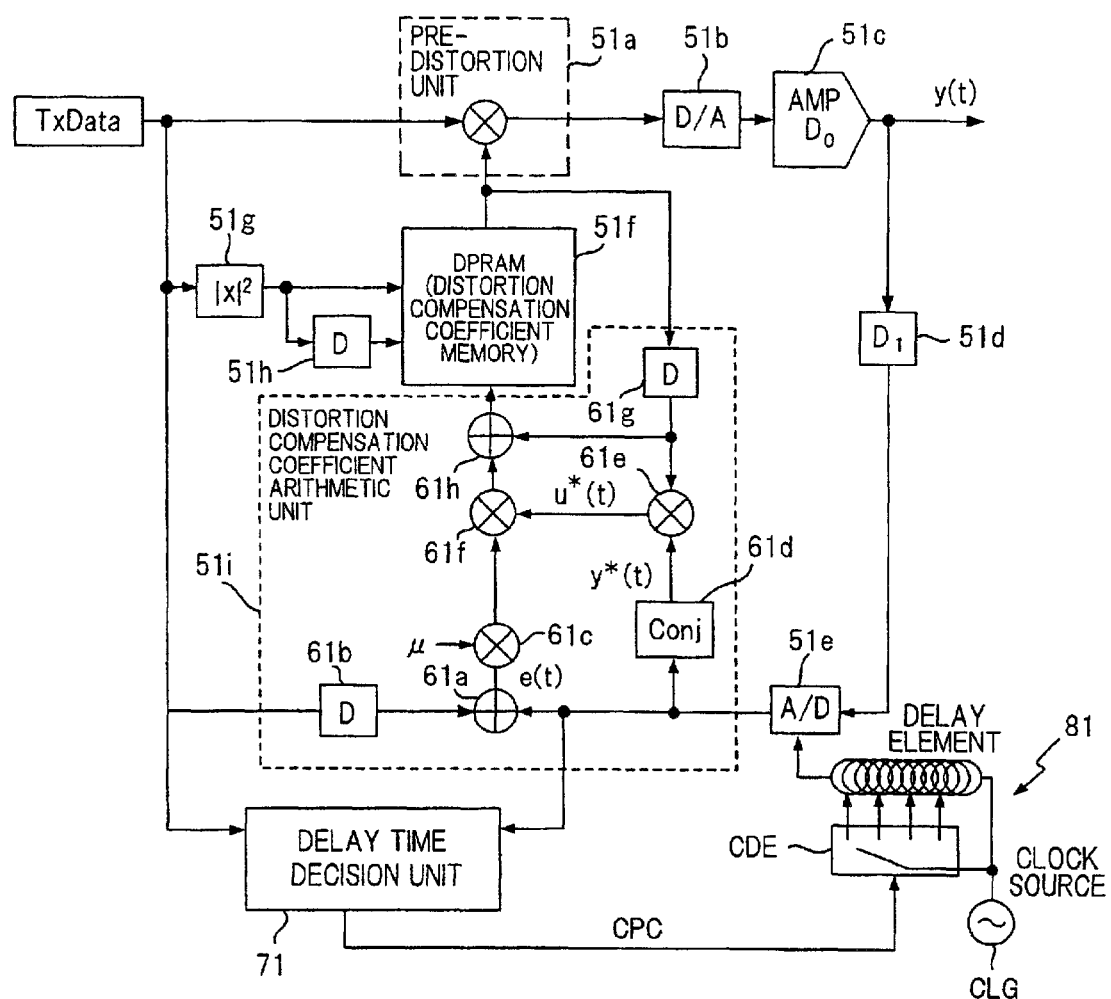
FIG. 15 shows the structure of a fourth embodiment of a delay time decision unit for deciding and setting a delay time with high precision.

FIG. 15 shows the structure of a fourth embodiment of a delay time decision unit for deciding the delay time with high precision. The same reference numerals are provided for the elements which are the same as those in the first embodiment. The fourth embodiment is different from the first embodiment in that the delay unit 81 is constituted by a clock phase variable circuit for varying the phase of the sampling clock of the A/D converter 51*e*. More specifically, the delay unit 81 is provided with a sampling clock generator CLG, and a clock phase delay element CDE for varying the clock phase by ΔD. If there is a need for increasing the amount of delay by ΔD at step 2004 in FIG. 11, the delay time decision unit 71 inputs a clock phase changing signal CPC into the delay unit 81. When the delay unit 81 receives the clock phase changing signal CPC, it increases the phase of the sampling clock by ΔD, and inputs the sampling clock into the A/D converter 51*e*. As a result, the sampling timing increases by ΔD, and the delay time increases by that amount.

(F) Delay Time Control During a Distortion Compensating Operation

In the above-described examples, the delay time is decided and set in the delay circuits before a distortion compensating operation. On the other hand, in the following examples, the delay time decision unit controls a change in the delay time caused during a distortion compensating operation.

(a) First Embodiment

Figure 16:
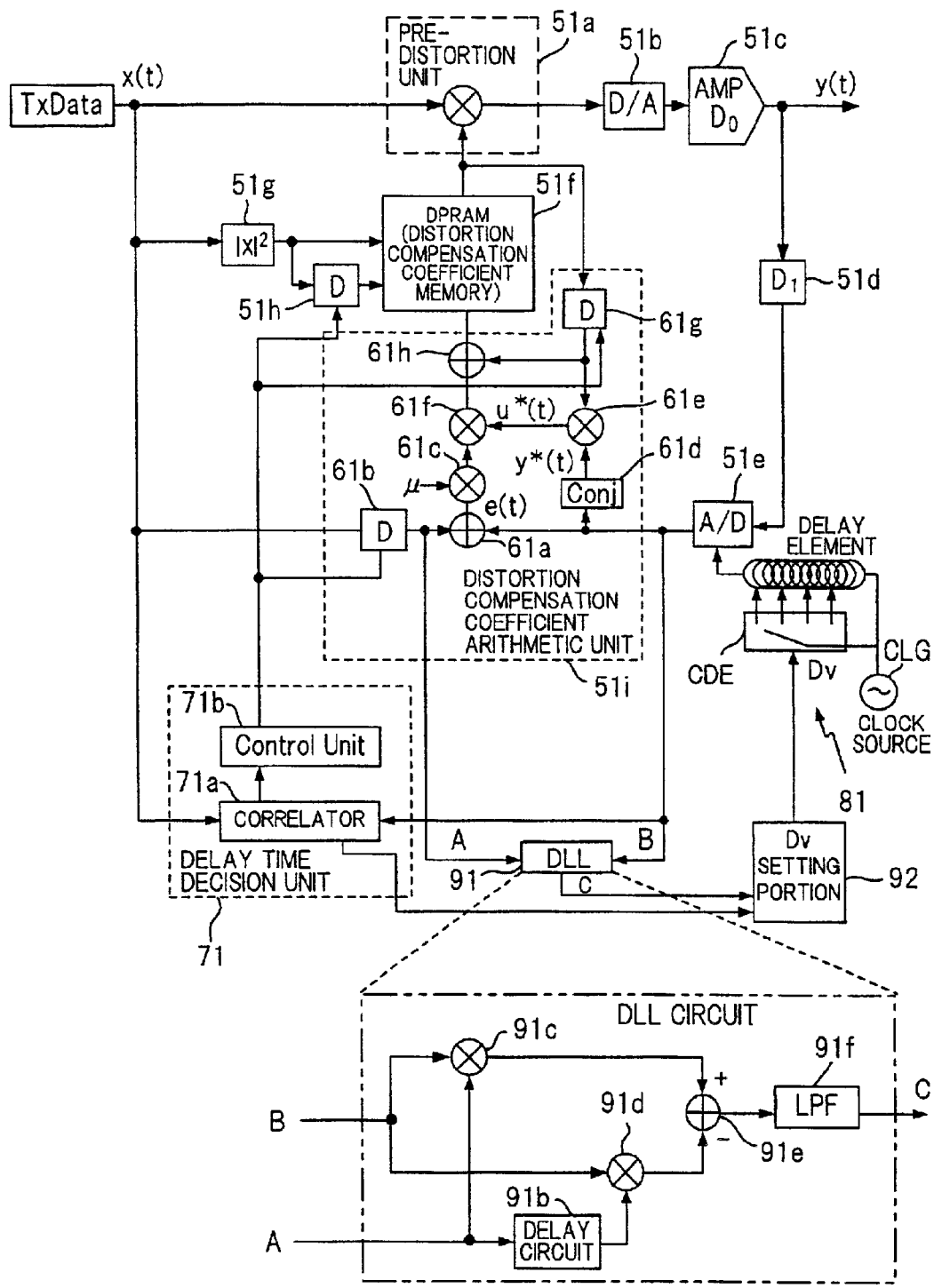
FIG. 16 shows an embodiment of a delay time decision unit which has a function of adjusting a change in the delay time caused during a distortion compensating operation to zero.

FIG. 16 shows an embodiment of a delay time decision unit which has a function of adjusting a change in the delay time caused during a distortion compensating operation to zero. The same reference numerals are provided for the elements which are the same as those shown in FIG. 15. This example is different from that shown in FIG. 15 in the following points:

(1) that a DLL (Delay Locked Loop) circuit 91 is provided;

(2) that a transmission signal A output from the delay circuit 61b and a feedback signal B output from the AD converter 51e are input into the DLL circuit 91;

(3) that a delay control signal C output from the DLL circuit 91 is input into the delay unit 81 via a Dv setting portion 92; and (4) that the DLL circuit 91 controls the clock frequency so that the phase is zero.

Figure 17:
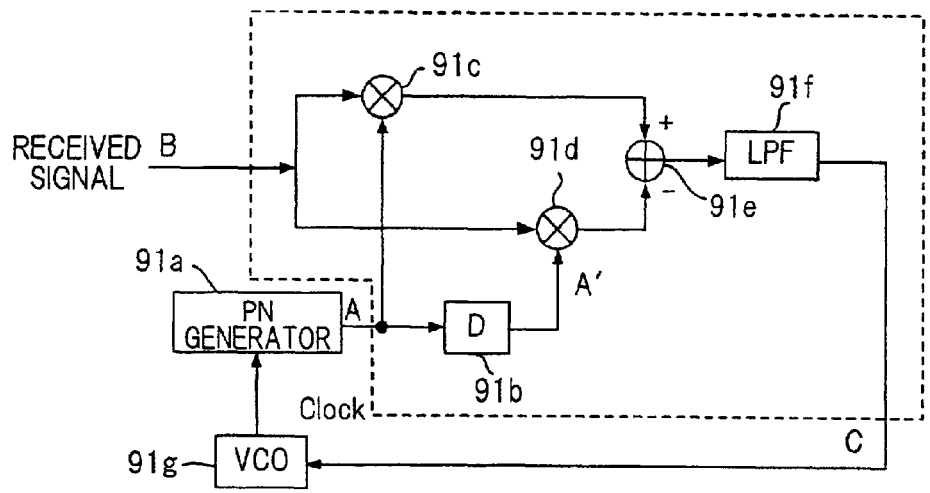
FIG. 17 is an explanatory view of the principle of a DLL circuit.
Figure 18:
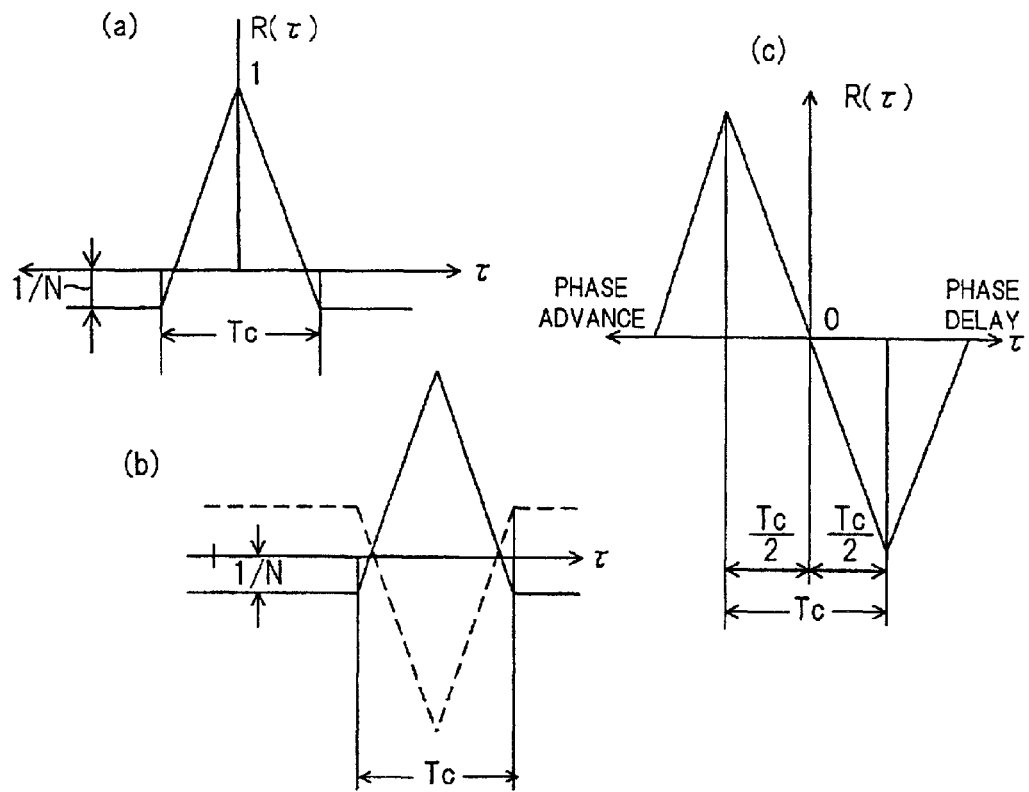
FIG. 18 is an explanatory view of the S curve of a DLL circuit.

FIG. 17 explains the principle of the DLL circuit, and FIG. 18 is an explanatory view of the S curve of the DLL. In communication using a DS-CDMA technique, a mobile station detects the phase of a spreading code of the transmission side with a precision of not more than 1 chip (synchronous acquisition), thereafter generates a train of spreading codes for the dispreading operation of the reception side, and executes a despreading operation in synchronism with the phase. If nothing is performed after the synchronous acquisition, the synchronization position is lost track of due to modulation or the influence of noise. It is therefore necessary to control the received signals which are successfully acquired in synchronism in such a manner as to prevent the train of spreading codes of the reception side from causing a time difference (synchronous tracking). As such a synchronous tracking circuit, a DLL circuit is known. In the example shown in FIG. 16, the DLL is used to control signals against a change in the delay time.

In FIG. 17, the reference numeral 91a denotes a PN generator for generating a PN sequence (reference spreading code) A which varies at a chip frequency. One period of the PN sequence A is constituted by N chips, and the PN sequence A is cyclically generated at intervals of 1 symbol period (=N·Tc). The reference numeral 91b denotes a delay circuit for delaying the PN sequence (reference spreading code) A by 1 chip period and outputting the delayed PN sequence A', 91c a multiplier for multiplying the PN sequence A output from the PN generator 91a by a received spreading data train B, chip by chip, 91d a multiplier for multiplying the PN sequence A' which is delayed by 1 chip period by the received spreading data train B, chip by chip, 91e an adder for adding the output of the multiplier 91c and the output of the multiplier 91d with the sign inverted, 91f a low pass filter, and 91g a voltage controlled oscillator (VOC) for varying the clock frequency (chip frequency) on the basis of the output of the low pass filter.

The multiplier 91c and the low pass filter 91f have a function of calculating the correlation between the PN sequence A and the received spreading data train B. If the phases of the PN sequence A and the received spreading data train B coincide, the correlation is the maximum, and the multiplier 91c outputs the correlation R(τ)=1, which has the width of 1 chip period, at intervals of 1 symbol (=N chips), as shown in (a) of FIG. 18. If the phase difference is more than 1 chip period, the correlation R(τ) is 1/N. The multiplier 91d and the low pass filter 91f are provided with a function of calculating the correlation between the PN sequence A' which is delayed by 1 chip period and the received spreading data train B. If the phases of the PN sequence A' and the received spreading data train B coincide, the correlation is the maximum, and the multiplier 91d outputs the correlation R(τ) shown in (b) of FIG. 18. If the phase difference is more than 1 chip period, the correlation R(τ) is 1/N. The adder 91e, which adds the output of the multiplier 91c and the output of the multiplier 91d with the sign inverted, outputs a signal having the S curve characteristic shown in (c) of FIG. 18 with respect to the phase differences via the low pass filter 91f.

The voltage controlled oscillator 91g controls the clock frequency on the basis of the output of the low pass filter 91f in such a manner that the phase difference is 0. For example, if the phase of the PN sequence (reference spreading code) is in advance of the phase of the received spreading code train B, the voltage controlled oscillator 91g lowers the clock frequency so that the phase difference is reduced to 0. On the other hand, if the phase of the PN sequence (reference spreading code) is behind the phase of the received spreading code train B, the voltage controlled oscillator 91g raises the clock frequency so that the phase difference is reduced to 0.

The DLL circuit 91 in the example shown in FIG. 16 has the structure framed by the dotted line in FIG. 17. In this example, a transmission signal output from the delay circuit 61 b is used in place of the PN sequence A, a feedback signal output from the AD A/D converter 51e is used in place of the received signal train B, and the output C of the filter 91f is input into the delay unit 81.

As explained above, in the example shown in FIG. 16, the delay time D and the amount Dv of delay are calculated in the state in which the DLL circuit 91 is turned off, in the method explained with reference to FIGS. 10 and 11, and these results are set in each of the delay circuits 51h, 61b and 61g, and the delay unit 81. Thereafter, when the DLL circuit 91 is activated, it shows the characteristic shown in (c) of FIG. 18 with respect to the phase difference between the transmission signal A output from the delay circuit 61b and the feedback signal B output from the A/D converter 51e, controls the clock frequency such that the error is zero, and outputs the delay control signal C.

(b) Second Embodiment

Figure 19:
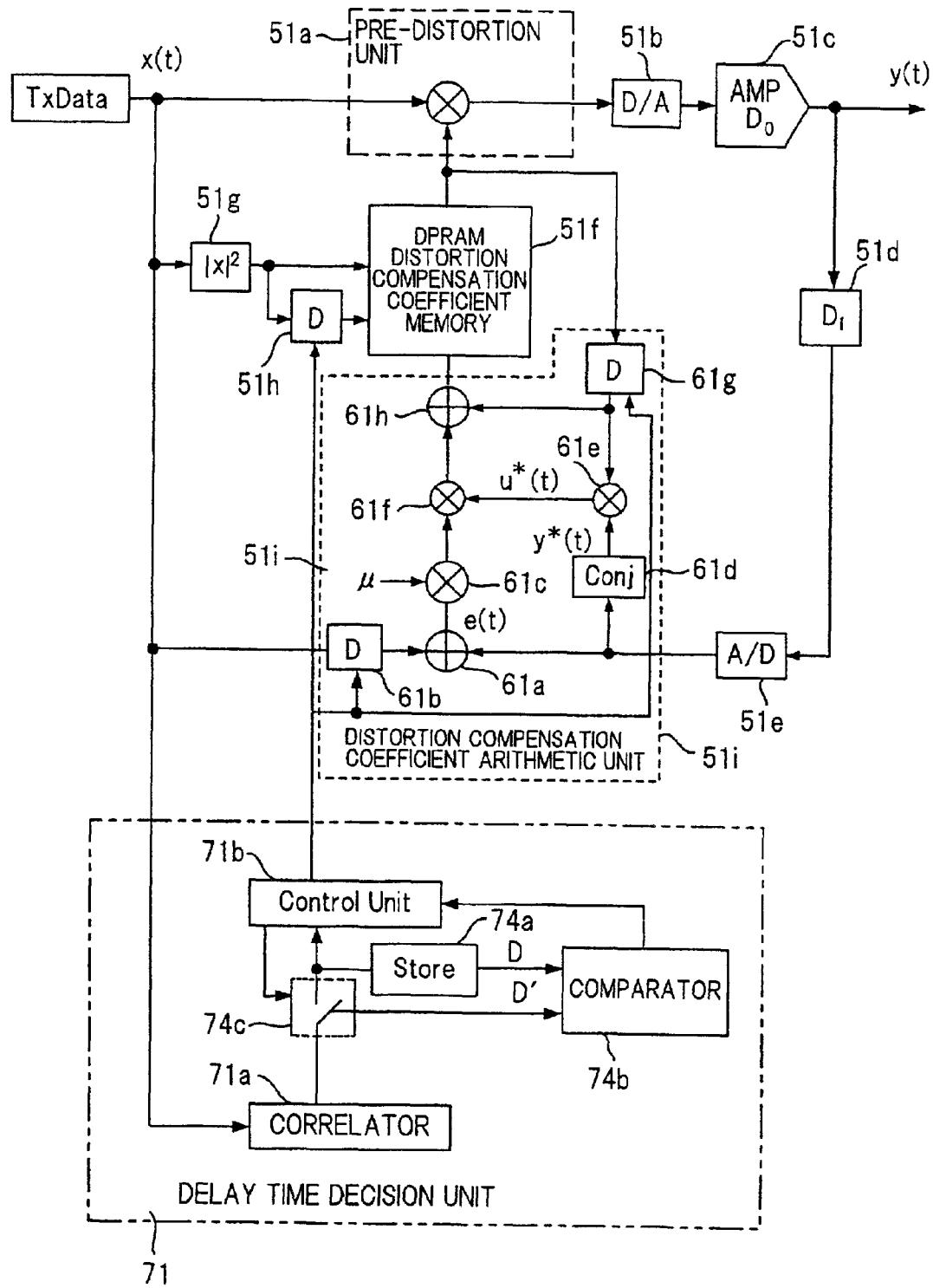
FIG. 19 shows an embodiment of a delay time decision unit which has a function of monitoring the correlation output during a distortion compensating operation, and keeping up with a change in the delay time.

FIG. 19 shows an embodiment of a delay time decision unit having a function of monitoring a correlation output during a distortion compensating operation and keeping up with a change in the delay time. The same reference numerals are provided for the elements which are the same as those shown in FIG. 1. This example is different from the embodiment shown in FIG. 1 in the structure of the delay time decision unit 71. In the delay time decision unit 71, the reference numeral 71a denotes the correlator, 71b the control unit, 74a a memory for storing the delay time D determined at the time of initiation, 74b a comparator for outputting the difference between the delay time D measured at the time of initiation and the delay time D' measured during a distortion compensating operation, and 74c a switching portion for inputting the output (correlation) of the correlator 71a at the time of initiation into the control unit 71b, and inputting the correlation into the comparator 74b during a distortion compensating operation.

The control unit 71b decides the delay time D on the basis of the timing at which the maximum correlation between a transmission signal and a feedback signal is generated at the time of initiation, and sets the delay time D in each of the delay circuits 51h, 61b and 61g. The control unit 71b also monitors whether the difference between the delay time D measured at the time of initiation and the delay time D' measured during a distortion compensating operation exceeds a threshold value or not on the basis of the output of the comparator 74b, and if it exceeds the threshold value, the control unit 71b stops the distortion compensating operation or the distortion compensation coefficient updating operation, and re-determines the delay time and resets it in each delay circuit.

During the distortion compensating operation, the distortion compensating coefficient in the distortion compensating coefficient memory 51 is updated in synchronism with the sampling period. When there is a change in the delay in a feedback system or the like with the lapse of time or for other reasons, the power leakage to the adjacent channels increases. The control unit 71b therefore obtains the correlation between a transmission signal and a feedback signal during a distortion compensating operation, and monitors whether the difference between the peak timing D' of the correlation and the peak timing D at the time of initiation is within a threshold value or not. If it exceeds the threshold value, the control unit 71b stops the update of the distortion compensation coefficient, re-determines the delay time, and resets the determined delay time in each of the delay circuits 51h, 61b and 61g.

(c) Third Embodiment

Figure 20:
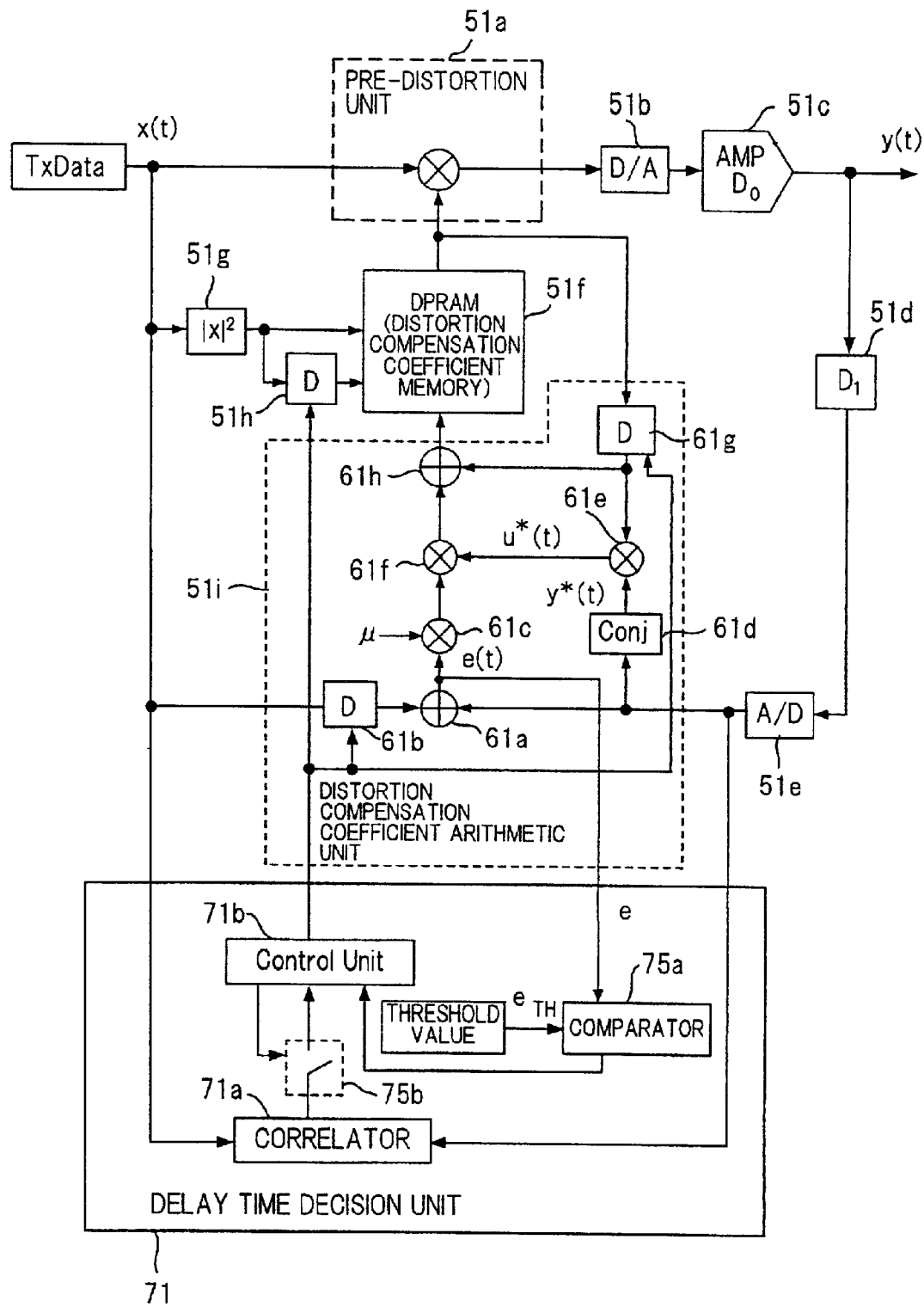
FIG. 20 shows an embodiment of a delay time decision unit which has a function of readjusting the delay time when an error exceeds a threshold value.

FIG. 20 shows an embodiment of a delay time decision unit which has a function of monitoring the output of the subtracter 61a of the distortion compensating apparatus during a distortion compensating operation and readjusting the delay time when the error exceeds a certain threshold value. The same reference numerals are provided for the elements which are the same as those shown in FIG. 1. This example is different from the embodiment shown in FIG. 1 in the structure of the delay time decision unit 71. In the delay time decision unit 71, the reference numeral 71a denotes the correlator, 71b the control unit, 75a a comparator for comparing the error e output from the subtracter 61a of the distortion compensating apparatus and a threshold value $e_{TH}$, and 75b a switch for inputting the output of the correlator 71a into the control unit 71b at the time of initiation.

The control unit 71b decides the delay time on the basis of the timing at which the correlation between a transmission signal and a feedback signal is the maximum at the time of initiation, and inputs the delay time into each of the delay circuits 51h, 61b and 61g. During the distortion compensating operation, the comparator 75a compares the error e output from the subtracter 61a with the threshold value $e_{TH}$, and inputs the result of comparison into the control unit 71b. If $e > e_{TH}$, the control unit 71b stops the distortion compensating operation or the distortion compensation coefficient updating operation, and re-determines the delay time and resets it into the delay circuits.

More specifically, if there is no change in the delay time after it is set, the distortion compensation coefficient is converged on a certain value, and the error e output from the subtracter 61a has a small value. In contrast, if there is a change in the delay time caused in the transmission power amplifier or the feedback loop, the error e output from the subtracter 61a has a larger value. Therefore, when the error e reaches a certain threshold value $e_{TH}$, the update of the distortion compensation coefficient is temporarily stopped, and after the readjustment/reset of the delay time, the distortion compensating apparatus is operated again.

Figure 21:
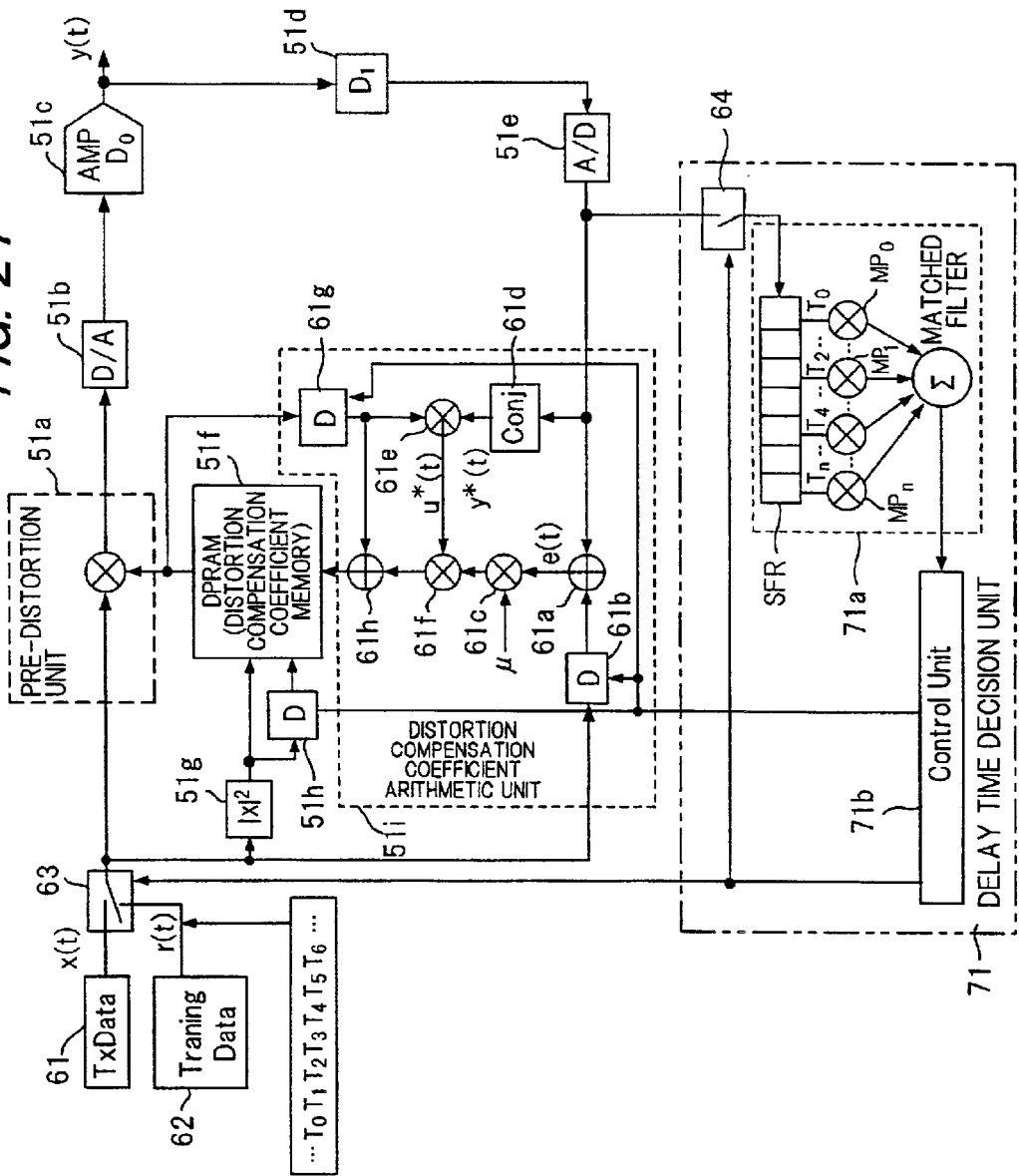

(G) Delay Time Decision Unit Calculating a Correlation by Using a Predetermined Reference Signal (a) First Embodiment FIG. 21 shows an embodiment of a delay time decision unit which adjusts the delay time by using training data r(t) when the power is turned on. The same reference numerals are provided for the elements which are the same as those shown in FIG. 1. This embodiment is different from the embodiment shown in FIG. 1 in (1) that the embodiment is further provided with a transmission signal generator 61, a training data generator 62, a switch for selecting the training data r(t) at the time of initiation and selecting a transmission signal x(t) during a distortion compensating operation, and a switch 64 which is on at the time of initiation and off during a distortion compensating operation structure, and (2) that the delay time decision unit 71 is composed of the matched filter 71a and the control unit 71b, and that known training data $T_0, T_1, T_2 \ldots n$ are fixedly input into one input terminal of each of the multipliers $MP_0 \sim MPn$ of the matched filter 71a.

At the time of training, the training data generator 62 generates known training data $T_0, T_1, T_2, \ldots Tn$, and the switch 63 selects the training data r(t) and inputs them into the distortion compensating apparatus. The switch 64 is turned on, and the feedback data output from the A/D converter 51e are input into the matched filter 71a of the delay time decision unit 71, which shifts the data to a shift register SFR and stores them.

Since the known training data $T_0, T_1, T_2, \ldots, Tn$ are fixedly input into one input terminal of the corresponding multipliers $MP_0 \sim MPn$, the matched filter 71a first multiplies the n feedback data stored in the shift register SFR by the n items of training data $T_0, T_1, T_2, \ldots, Tn$, respectively, and the adder ADD adds the products and inputs the correlation at the delay time 0·Ts into the control unit 71b. In the next sampling period, the contents of the shift register SFR are shifted, and the matched filter 71a multiplies the n feedback data after the shift by the n items of training data $T_0, T_1, T_2, \ldots, Tn$, respectively, and the adder ADD adds the products and inputs the correlation at the delay time 1·Ts into the control unit 71b. Thereafter, the correlations at the delay times 0·Ts~(N−1)·Ts are calculated in the same way, and the control unit 71b determines the delay time on the basis of the timing at which the correlation is the maximum and sets the delay time in each of the delay circuits 51h, 61b and 61g.

In this manner, by using the training signals, it is possible to fix a transmission signal (reference signal) input to the correlator, thereby simplifying the apparatus.

(b) Second Embodiment

Figure 22:
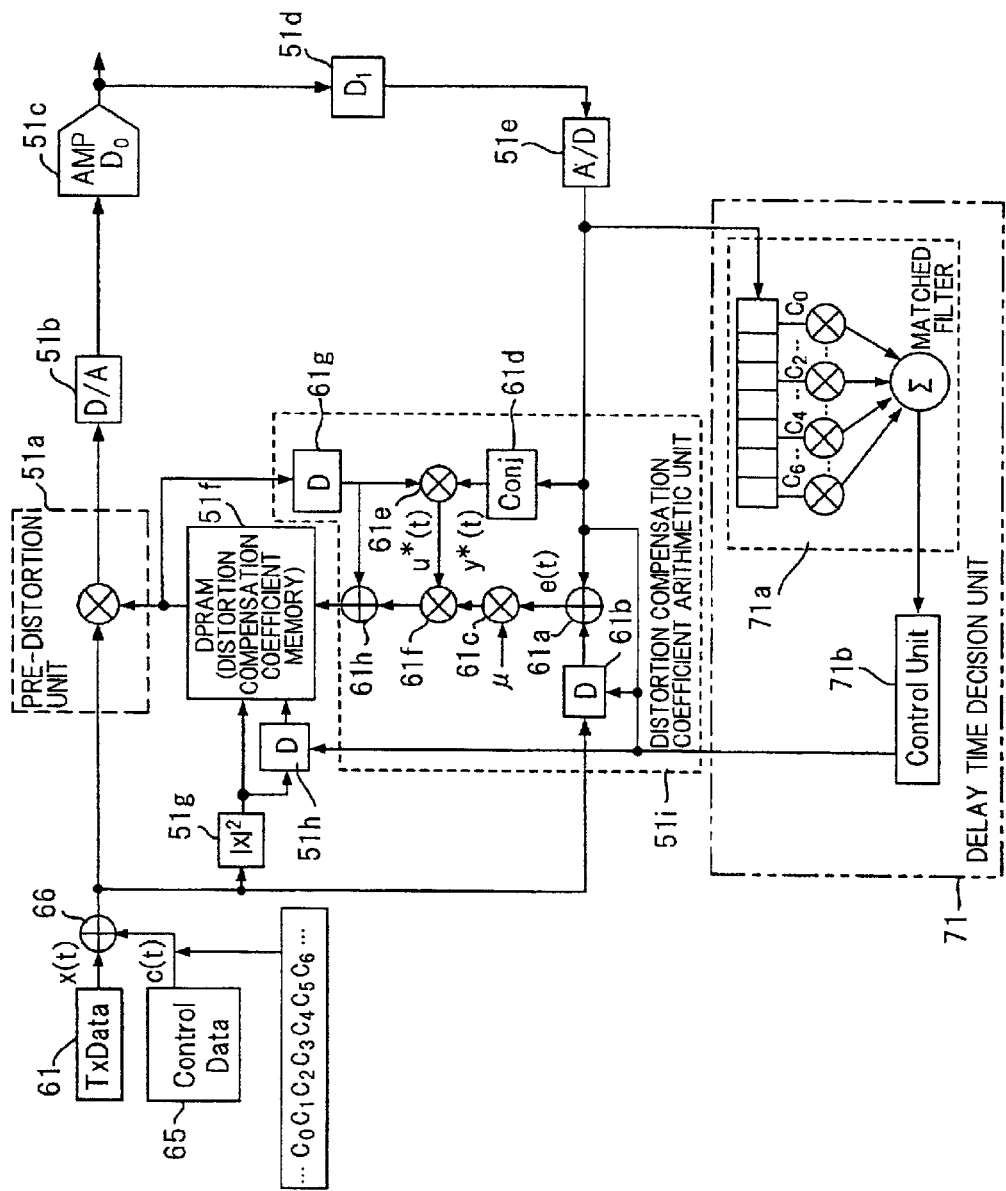
FIG. 22 shows an embodiment of a delay time decision unit which adjusts the delay time by using signals which are constantly transmitted in a CDMA.
Figure 23:
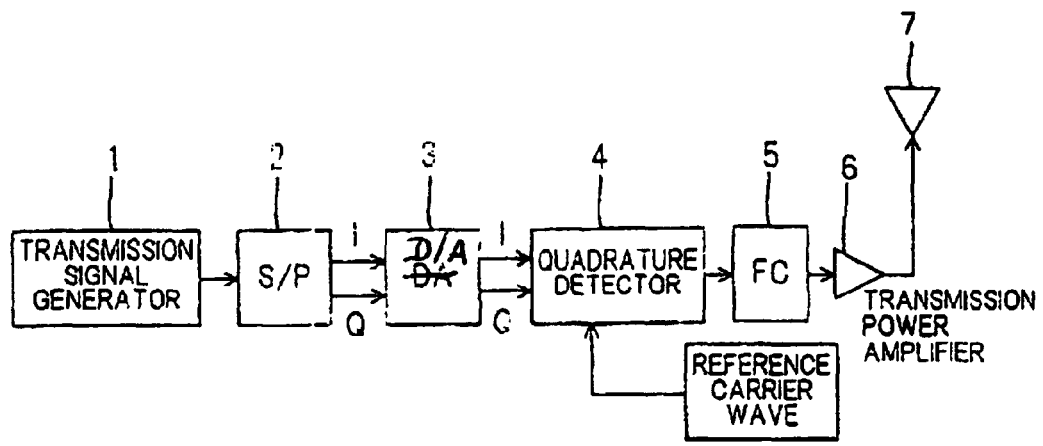
FIG. 23 shows the structure of a conventional transmitting apparatus.
Figure 24A:
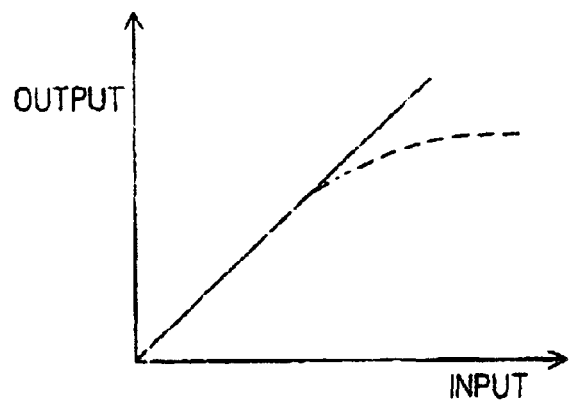
FIGS. 24A and 24B are explanatory views of a problem caused by the nonlinearity of a transmission power amplifier.
Figure 24B:
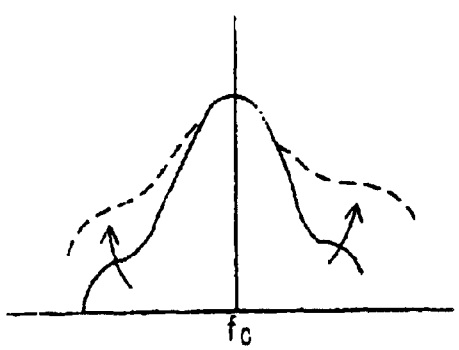
Figure 25:
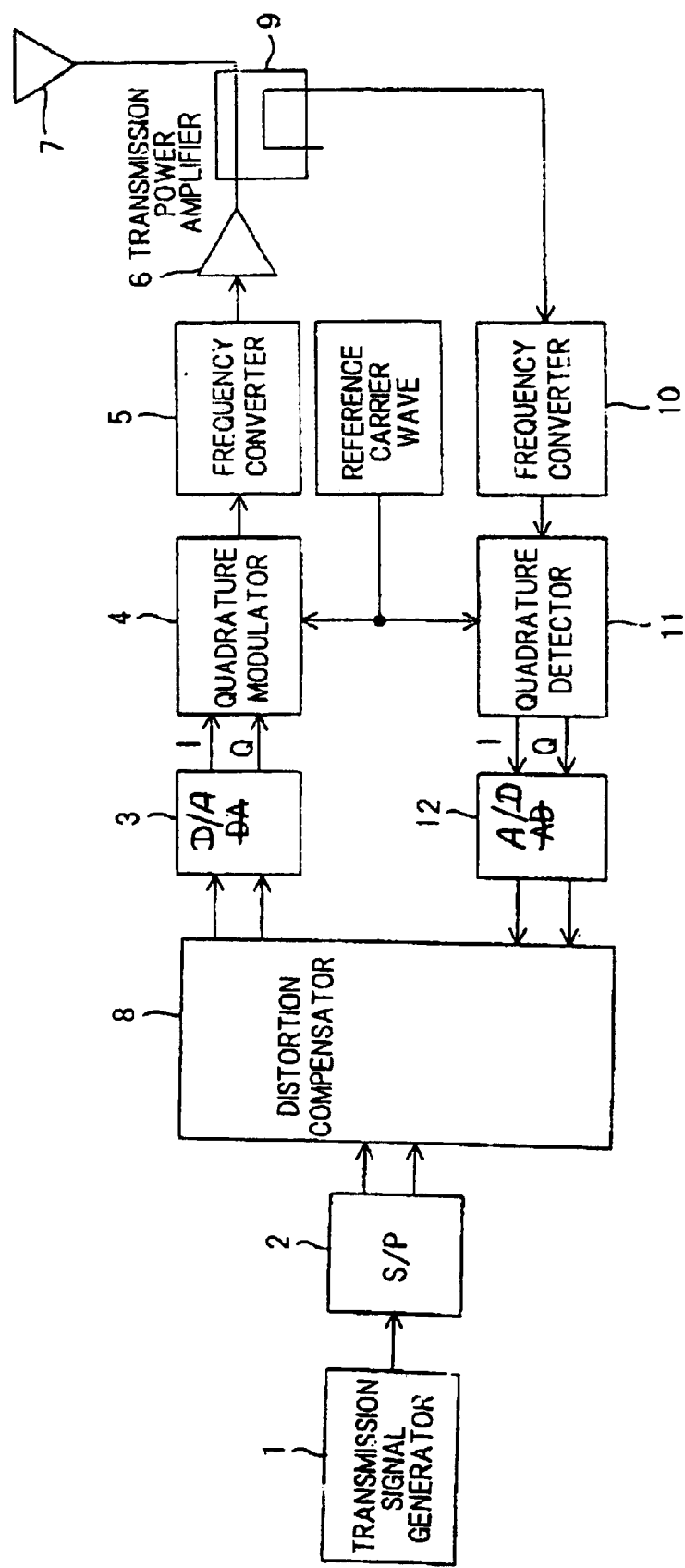
FIG. 25 shows the structure of a conventional transmitting apparatus having a function of digitally compensating for a nonlinear distortion.
Figure 26:
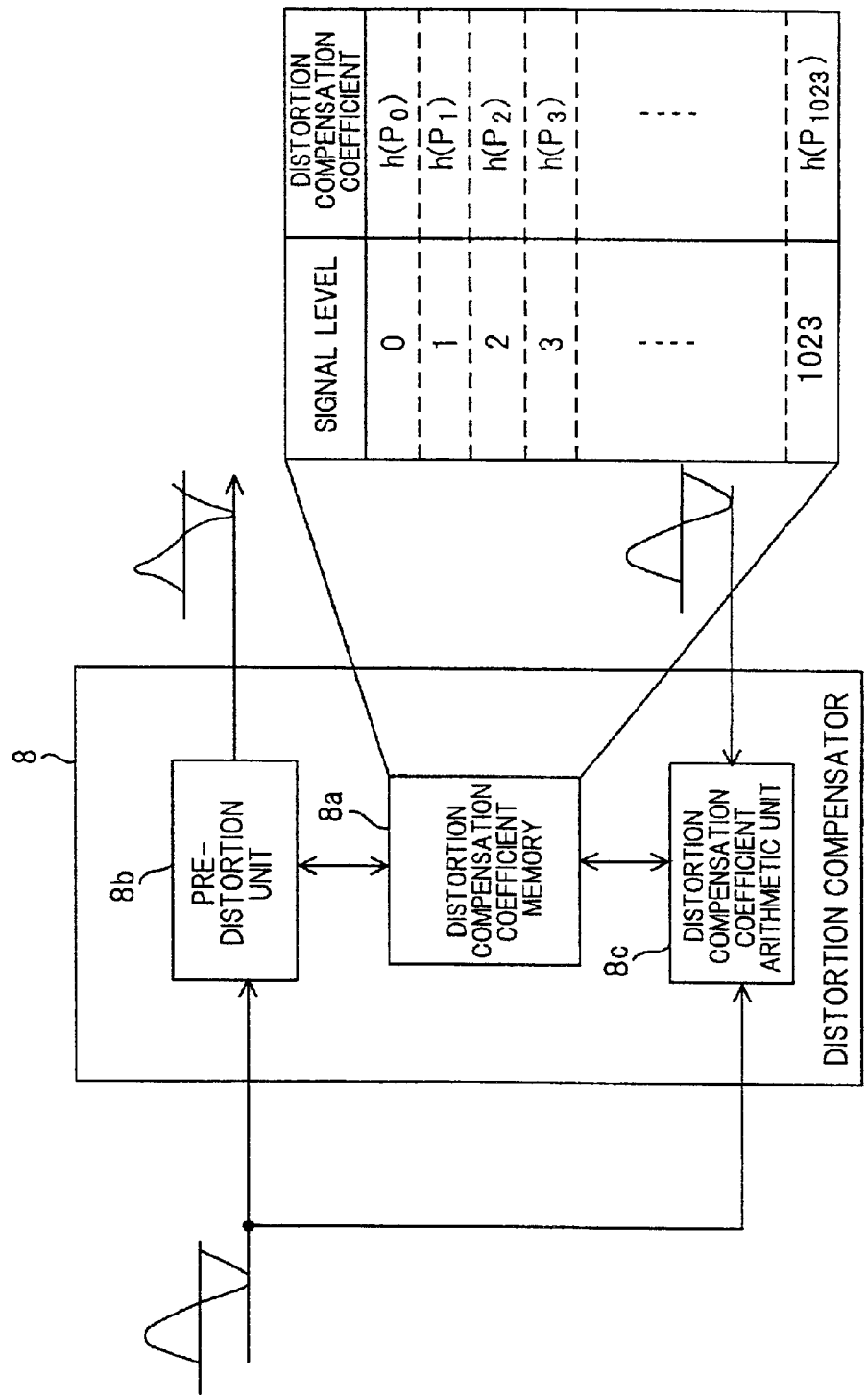
FIG. 26 shows the structure of a distortion compensator in the apparatus shown in FIG. 25.
Figure 27:
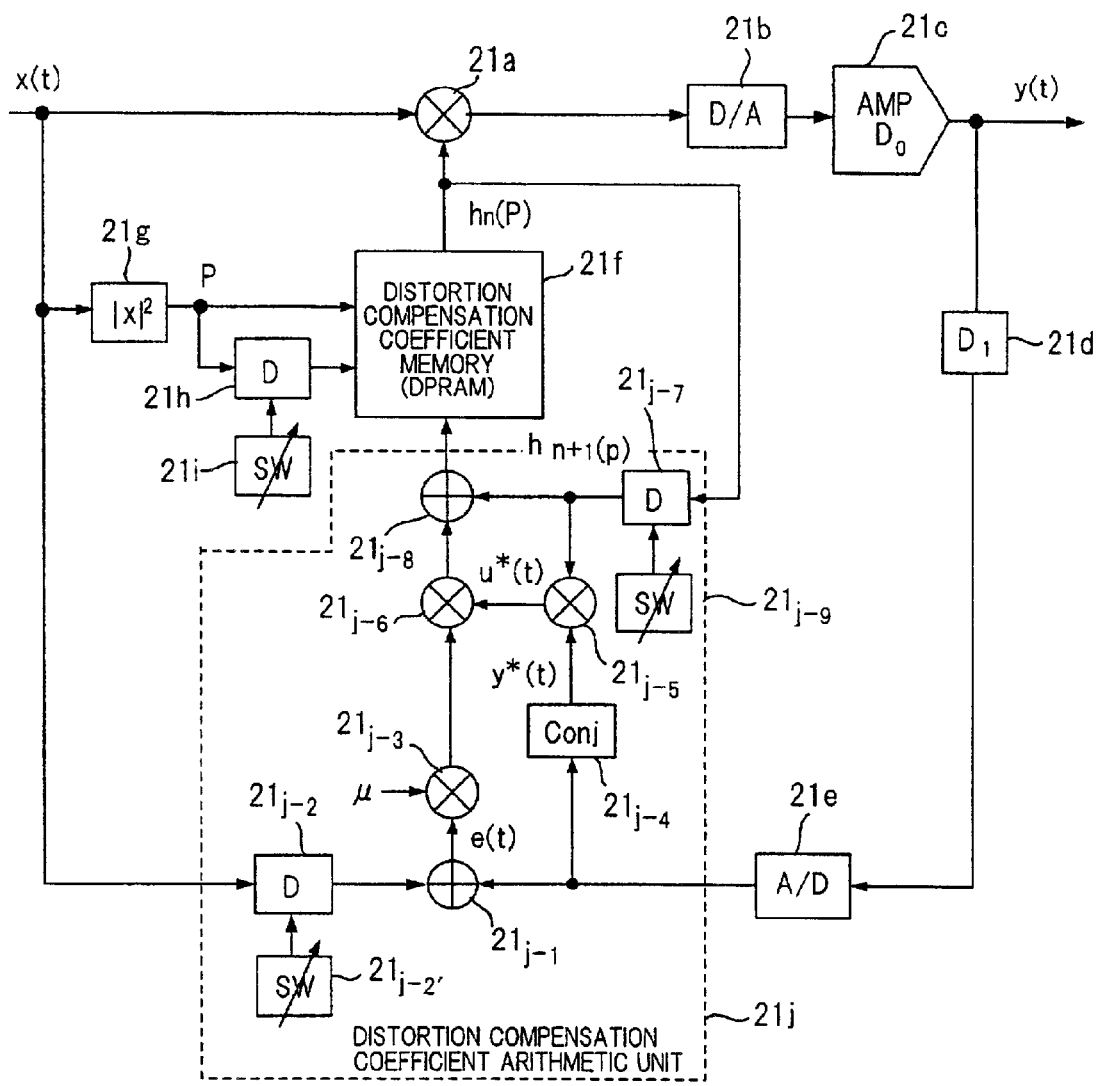
FIG. 27 is an explanatory view of a distortion compensation processing based on an adaptive algorithm using the LMS (Least Means Square) method.

FIG. 22 shows an embodiment of a distortion compensating apparatus attached to a CDMA apparatus. The delay time decision unit adjusts the delay time by using signals which are constantly transmitted in a CDMA. The same reference numerals are provided for the elements which are the same as those shown in FIG. 1. This embodiment is different from the embodiment shown in FIG. 1 in the following points:

(1) that the embodiment is further provided with a transmission data generator 61 for generating transmission data x(t), a control data generator 65 for generating control data c(t) inserted into the transmission data x(t), and a synthesizer 66 for synthesizing the control data c(t) with the transmission data x(t); and (2) that the delay time decision unit 71 is constituted by the matched filter 71a and the control unit 71b, and that known control data $C_0, C_1, C_2, \ldots, Cn$ are fixedly input into one input terminal of the corresponding multipliers $MP_0 \sim MPn$ of the matched filter 71a.

At the time of setting the delay time, the synthesizer 66 synthesizes the control data c(t) with the transmission data x(t) and inputs them into the distortion compensating apparatus. The feedback data are input into the matched filter 71a of the delay time decision unit 71, and the matched filter 71a shifts the feedback data to the shift register SFR and stores them.

Since the known control data $C_0, C_1, C_2, \ldots, Cn$ are fixedly set in one input terminal of each of the multipliers $MP_0$~$MPn$, the matched filter 71a first multiplies the n feedback data stored in the shift register SFR by the n items of control data $C_0, C_1, C_2, \ldots, Cn$, respectively, and the adder ADD adds the products and inputs the correlation at the delay time 0·Ts into the control unit 71b. In the next sampling period, the contents of the shift register SFR are shifted, and the matched filter 71a multiplies the n feedback data after the shift by the n items of training data $C_0, C_1, C_2, \ldots, Cn$, respectively, and the adder ADD adds the products and inputs the correlation at the delay time 1·Ts into the control unit 71b. Thereafter, the correlations at the delay times 0·Ts~(N−1)·Ts are calculated in the same way, and the control unit 71b determines the delay time on the basis of the timing at which the correlation is the maximum and sets the delay time in each delay circuit.

In the CDMA system, there exist signals such as pilot signals and control signals which are constantly transmitted. By using these signals, the delay time is adjusted. For example, an introduction signal having a fixed pattern is incorporated into a control signal at a certain interval of time, the matched filter is operated at the timing of transmitting the introduction signal, and the timing at which the maximum correlation is output is set as the delay time.

In the above explanation, the distortion characteristic of a transmission power amplifier is compensated for. The distortion compensating apparatus according to the present invention is also applicable to another device in which a distortion generates.

As described above, according to the present invention, it is possible to automatically determine the delay time in a device in which a distortion generates, for example, a transmission power amplifier and a feedback loop on the basis of the maximum correlation between a transmission signal and a feedback signal, and set the delay time in a delay circuit.

According to the present invention, if a transmission signal is sampled N times, since (1) the phase (time difference) of the transmission signal x(t) and a feedback signal y(t) is sequentially shifted at intervals of N×the sampling period and the correlations are obtained, (2) the correlations between transmission signals x(t) and feedback signals y(t) in the vicinity of the phase in which the correlation obtained in the first stage (1) is the maximum are obtained while the phase is sequentially shifted at intervals of the sampling period, and (3) the delay time is determined on the basis of the phase in which the correlation obtained in the second stage (2) is the maximum, it is possible to shorten the time required for determining the delay time.

In addition, according to the present invention, correlations are calculated for a plurality of periods and stored, the average values of the correlations at the timings corresponding to the plurality of periods are calculated, and the delay time is determined on the basis of the timing at which the average value of the correlations is the maximum, it is possible to determine the delay time with high precision and set it in each delay circuit.

According to the present invention, a sliding correlator or a matched filter is used as a correlator. If a sliding correlator is used, the structure of a distortion compensating apparatus is simplified. If a matched filter is used, it is possible to shorten the time for determining the delay time.

Further, according to the present invention, since the delay time decision unit periodically calculates the correlation between a transmission signal and a feedback signal even during a distortion compensating operation, and stops the distortion compensating operation or a correlation updating operation when the difference between the delay time at which the correlation is the maximum and the delay time determined at the time of initiation exceeds a preset time, and the delay time is re-determined and reset in each delay circuit, it is possible to re-determine and reset the delay time and maintain the effect of distortion compensation, when the delay in a feedback system or the like changes with the lapse of time or for other reasons and the power leaked to the adjacent channels increases.

According to the present invention, the delay time decision unit monitors the difference between a transmission signal and a feedback signal during a distortion compensating operation, and stops the distortion compensating operation or a correlation updating operation so as to re-determine the delay time and reset it in a delay circuit, when the difference exceeds a certain threshold value. When the delay in a feedback system changes with the lapse of time or for other reasons and the power leaked to the adjacent channels increases, the difference increases. It is therefore possible to re-determine the delay time and reset it in the delay circuits, and to maintain the effect of distortion compensation by monitoring the difference.

In addition, according to the present invention, when there are known signals which are constantly transmitted, the delay time decision unit calculates correlations between the known signals and feedback signals, and determines the delay time on the basis of the maximum correlation. It is therefore possible to fix a reference signals in the calculation of correlations, which simplifies the structure of the decision unit and enables calculation of correlations with high precision.

According to the present invention, since the delay time decision unit calculates correlations between training signals which are inserted into a transmission signal and feedback signals at the time of decision of the delay time, and determines the delay time on the basis of the maximum correlation, it is possible to fix a reference signal in the calculation of correlations, which simplifies the structure of the decision unit and enables calculation of correlations with high precision.

Moreover, according to the present invention, since the delay time is so controlled as to be constant by using a DLL circuit, it is possible to maintain the total delay time at a constant value and display the effect of distortion compensation, even if the delay time in a feedback system or the like changes with the lapse of time or for other reasons.

Furthermore, according to the present invention, since (1) a delay unit for so controlling the amount Dv of delay of a feedback signal as to be smaller than the sampling period of a transmission signal is inserted into a feedback loop, (2) the delay time decision unit obtains the delay time in the sampling period in which the correlation is the maximum, while the amount of delay in the delay units is kept constant, and (3) the amount of delay in the delay unit is adjusted in such a manner that the correlation between a transmission signal and a feedback signal is the maximum, decision and setting of the delay time with high precision is enabled. As the delay unit, (1) an analog filter, (2) a digital filter, (3) a sampling clock phase variable circuit of an AD converter or the like is usable.

As many apparently widely different embodiments of the present invention can be made without departing from the spirit and scope thereof, it is to be understood that the invention is not limited to the specific embodiments thereof except as defined in the depended claims.

What is claimed is:

1. Distortion compensating apparatus including a predistortion unit for applying a distortion compensation processing to an input signal by using a distortion compensation coefficient, a distortion compensation coefficient arithmetic unit for calculating a distortion compensation coefficient on the basis of said input signal before said distortion compensation processing and a feedback signal sent from an output side of a transmission power amplifier in which a distortion generates, and a distortion compensation coefficient memory for storing the calculated distortion compensation coefficient in correspondence with said input signal, comprising;

a delay time decision unit for calculating a correlation between said input signal and said feedback signal while varying a phase difference between both signals, and deciding the total delay time caused in said transmission power amplifier and a feedback loop on the basis of the phase difference in which said correlation is the maximum; and a delay unit for delaying said input signal by the decided delay time, and inputting the delayed input signal into said distortion compensation coefficient arithmetic unit.

2. Distortion compensating apparatus including a predistortion unit for applying a distortion compensation processing to a transmission signal by using a distortion compensation coefficient at a sampling period of the transmission signal, a distortion compensation coefficient arithmetic unit for calculating a distortion compensation coefficient on the basis of said transmission signal before said distortion compensation processing and a feedback signal sent from an output side of a transmission power amplifier, and a distortion compensation coefficient memory for storing the calculated distortion compensation coefficient in correspondence with said transmission signal, comprising:

a delay time decision unit for calculating a correlation between said transmission signal and said feedback signal while varying a phase difference between both signals, and deciding the total delay time caused in said transmission power amplifier and a feedback loop on the basis of the phase difference in which said correlation is the maximum; and a transmission signal delay unit for delaying said transmission signal before said distortion compensation processing by the decided total delay time, and inputting the delayed transmission signal into said distortion compensation coefficient arithmetic unit.

3. A distortion compensating apparatus according to claim 2, further comprising: a delay circuit in which a delay time is set so as to adjust the timing of each part of said distortion compensating apparatus, wherein said delay time decision unit sets said decided total delay time in said delay circuit.

4. A distortion compensating apparatus according to claim 2, wherein said delay time decision unit includes:

an arithmetic unit for periodically calculating the correlation between said transmission signal and said feedback signal during a distortion compensating operation, and calculating the difference between the delay time at which said correlation is the maximum and said decided total delay time; and a means for stopping a distortion compensation coefficient updating operation or said distortion compensating operation so as to decide said total delay time again and reset decided total delay time in said transmission signal delay unit, when said difference is not less than a preset value.

5. A distortion compensating apparatus according to claim 2, wherein said delay time decision unit includes:

a means for monitoring the phase difference between said transmission signal and said feedback signal during a distortion compensating operation; and a means for stopping a distortion compensation coefficient updating operation or said distortion compensating operation so as to decide said total delay time again and reset decided total delay time in said transmission signal delay unit, when said difference exceeds a certain threshold value.

6. A distortion compensating apparatus according to claim 2, wherein said delay time decision unit calculates the correlation between a known signal which is constantly transmitted and said feedback signal by varying the phase difference between both signals, and deciding said delay time on the basis of the phase difference in which said correlation is the maximum.

7. A distortion compensating apparatus according to claim 2, wherein, at the time of deciding said total delay time, said delay time decision unit calculates the correlation between a training signal which is inserted into said transmission signal and said feedback signal by varying the phase difference between both signals, and decides said total delay time on the basis of the phase difference in which said correlation is the maximum.

8. A distortion compensating apparatus according to claim 2, further comprising:

a DLL (Delay Locked Loop) circuit into which a signal output from said transmission signal delay unit and said feedback signal are input, and which operates in such a manner that the phase difference between both signals is zero; and a delay means for delaying the feedback signal based upon the output of said DLL circuit.

9. A distortion compensating apparatus according to claim 2, wherein said delay time decision unit includes:

a correlator for sequentially varying the time difference between said transmission signal and said feedback signal at interval of a sampling time, and calculating the correlation between said transmission signal and said feedback signal in each time difference; and a control unit for setting the time difference in which said correlation is the maximum in said transmission signal delay unit as said total delay time caused in said transmission power amplifier and said feedback loop.

10. A distortion compensating apparatus according to claim 9, wherein said delay time decision unit calculates said correlation between said transmission signal and said feedback signal by using a sliding correlator.

11. A distortion compensating apparatus according to claim 2, wherein said delay time decision unit includes:

a means for obtaining correlation between said transmission signal and said feedback signal when said transmission signal is sampled at an oversampling period which is 1/N of a normal sampling period, by sequentially shifting the time difference between both signals at an interval of the normal sample period(=N× oversampling period), and obtaining the first time difference in the unit of the normal sampling period in which the correlation is the maximum;

a means for calculating correlation between the transmission signal and the feedback signal in the vicinity of said first time difference by sequentially shifting the time difference between both signals at interval of the oversampling period, and obtaining the second time difference in the unit of oversampling period in which the correlation is the maximum; and a means for determining said total delay time on the basis of first and second the time differences.

12. A distortion compensating apparatus according to claim 9, wherein said delay time decision unit calculates said correlation between said transmission signal and said feedback signal by using a matched filter.

13. A distortion compensating apparatus according to claim 9, wherein the filter length of said matched filter is shorter than the total amount of delay time caused in said transmission power amplifier and said feedback loop, and said total delay time is obtained by controlling calculation timing of the correlation between said feedback signal and said transmission signal.

14. A distortion compensating apparatus according to claim 2, wherein said delay time decision unit includes:

a means for calculating said correlation between said transmission signal and said feedback signal by sequentially changing the time difference at an interval of a sampling period for one period of the transmission signal;

a means for calculating and storing correlations for each of a plurality of periods of said transmission signal;

a means for calculating average value of the correlations for said plurality of periods of said transmission signal for each time difference; and a means for determining said total delay time on the basis of the time difference in which the average value is the maximum.

15. Distortion compensating apparatus including a predistortion unit for applying a distortion compensation processing to a transmission signal by using a distortion compensation coefficient at sampling period of the transmission signal, a distortion compensation coefficient arithmetic unit for calculating a distortion compensation coefficient on the basis of said transmission signal before said distortion compensation processing and a feedback signal sent from the output side of a transmission power amplifier, and a distortion compensation coefficient memory for storing the calculated distortion compensation coefficient in correspondence with said transmission signal, comprising:

a feedback signal delay unit for controlling the amount of delay of said feedback signal at an interval of time shorter than the sampling period of said transmission signal;

a correlator for calculating the correlation between said transmission signal and said feedback signal by sequentially changing the time difference between both signals at an interval of said sampling period;

a control unit for obtaining the amount of delay in said feedback signal delay unit and the time difference in which said correlation is the maximum, and determining the total delay time caused in said transmission power amplifier and a feedback loop on the basis of said amount of delay and said time difference: and a transmission signal delay unit for delaying said transmission signal by said total delay time and inputting the delayed transmission signal into said distortion compensation coefficient apparatus arithmetic unit.

16. A distortion compensating apparatus according to claim 15, wherein said control unit obtains the time difference in the unit of sampling period in which said correlation is the maximum, while the amount of delay in said feedback signal delay unit is kept constant, and then adjusts the amount of delay in said feedback signal delay unit in such a manner that said correlation is the maximum in the state in which said time difference between said transmission signal and said feedback signal in said correlator is fixed at said delay time.

17. A distortion compensating apparatus according to claim 15, further comprising:

a delay circuit with a delay time set therein for adjusting the timing of each part of said distortion compensating apparatus;

wherein said control unit sets said total delay time in said delay circuit and adjusts said timing.

18. A distortion compensating apparatus according to claim 15, wherein said control unit obtains the time difference in the unit of sampling period in which said correlation is the maximum, while the amount of delay in said feedback signal delay unit is kept constant, sets said time difference in said transmission signal delay unit, and then adjusts the amount of delay in said feedback signal delay unit in such a manner that said correlation is the maximum while fixing the time difference between said transmission signal and said feedback signal in said correlator at zero.

19. A distortion compensating apparatus according to claim 15, wherein said feedback signal delay unit is an analog delay unit.

20. A distortion compensating apparatus according to claim 15, wherein said feedback signal delay unit is an analog filter.

21. A distortion compensating apparatus according to claim 15, wherein said feedback signal delay unit is a digital filter.

22. A distortion compensating apparatus according to claim 15, wherein said feedback signal delay unit is a sampling clock phase variable circuit for varying the phase of a sampling clock of an AD converter which is inserted into a feedback system.

* * * * *